US010735134B2

(12) United States Patent
Soriaga et al.

(10) Patent No.: US 10,735,134 B2
(45) Date of Patent: Aug. 4, 2020

(54) SELF-DECODABLE REDUNDANCY VERSIONS FOR LOW-DENSITY PARITY-CHECK CODES

(71) Applicant: QUALCOMM Incorporated, San Diego, CA (US)

(72) Inventors: Joseph Binamira Soriaga, San Diego, CA (US); Shrinivas Kudekar, Raritan, NJ (US); Thomas Joseph Richardson, South Orange, NJ (US); Gabi Sarkis, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 66 days.

(21) Appl. No.: 16/058,196

(22) Filed: Aug. 8, 2018

(65) Prior Publication Data

US 2019/0052400 A1 Feb. 14, 2019

Related U.S. Application Data

(60) Provisional application No. 62/544,760, filed on Aug. 11, 2017.

(51) Int. Cl.
*H04L 1/00* (2006.01)
*H03M 13/00* (2006.01)
(Continued)

(52) U.S. Cl.
CPC ....... *H04L 1/0041* (2013.01); *H03M 13/1102* (2013.01); *H03M 13/116* (2013.01);
(Continued)

(58) Field of Classification Search
CPC ......... H03M 13/6306; H03M 13/1102; H03M 13/1185; H03M 13/618; H03M 13/27;
(Continued)

(56) References Cited

U.S. PATENT DOCUMENTS 6,633,865 B1 10/2003 Liao
6,961,888 B2 11/2005 Jin et al.
(Continued)

FOREIGN PATENT DOCUMENTS

WO WO-2017123273 A1 7/2017

OTHER PUBLICATIONS

Ericsson: "Bit Ordering for Circular Buffer of LDPC Codes", 3GPP Draft, R1-1710484, Bit Ordering for Circular Buffer of LDPC Codes, 3rd Generation Partnership Project (3GPP), Mobile Competence Centre, 650, Route Des Lucioles, F-06921 Sophia-Antipolis Cedex, vol. RAN WG1, No. Qingdao, P.R. China; Jun. 27, 2017-Jun. 30, 2017, Jun. 26, 2017 (Jun. 26, 2017), XP051299695, 4 pages, Retrieved from the Internet: URL: http://www.3gpp.org/ftp/Meetings_3GPP_SYNC/RAN1/Docs/ [retrieved on Jun. 26, 2017].

(Continued)

*Primary Examiner* — Guy J Lamarre
(74) *Attorney, Agent, or Firm* — Holland & Hart LLP

(57) ABSTRACT

Methods, systems, and devices for wireless communication are described. In some examples, a wireless device (e.g., a user equipment (UE) or a base station) may encode a codeword from a set of information bits using an LDPC code. The wireless device may then transmit multiple versions of the codeword to improve the chances of the codeword being received. In some aspects, the wireless device may use the techniques herein to generate self-decodable redundancy versions of the codeword to be transmitted to the receiving device. Accordingly, a receiving device may be able to identify information bits from one or more redundancy versions of the codeword even if the receiving device failed to receive an original transmission of the codeword.

28 Claims, 15 Drawing Sheets

(51) Int. Cl.
| | |
|---|---|
| *H03M 13/11* | (2006.01) |
| *H04L 1/18* | (2006.01) |
| *H03M 13/27* | (2006.01) |
| *H04L 1/08* | (2006.01) |

(52) U.S. Cl.
CPC ....... *H03M 13/1185* (2013.01); *H03M 13/27* (2013.01); *H03M 13/618* (2013.01); *H03M 13/6306* (2013.01); *H03M 13/6393* (2013.01); *H04L 1/0057* (2013.01); *H04L 1/08* (2013.01); *H04L 1/1819* (2013.01); *H04L 1/1835* (2013.01); *H03M 13/2742* (2013.01); *H04L 1/00* (2013.01)

(58) Field of Classification Search
CPC ........... H03M 13/116; H03M 13/6393; H03M 13/2742; H04L 1/08; H04L 1/1819; H04L 1/1835; H04L 1/0041; H04L 1/0057; H04L 1/00
See application file for complete search history.

(56) References Cited

U.S. PATENT DOCUMENTS

| | | | |
|---|---|---|---|
| 7,133,853 | B2 | 11/2006 | Richardson et al. |
| 7,552,097 | B2 | 6/2009 | Richardson et al. |
| 7,627,801 | B2 | 12/2009 | Jin et al. |
| 8,751,902 | B2 | 6/2014 | Jin et al. |
| 2019/0207710 | A1* | 7/2019 | Ye ...................... H03M 13/1102 |
| 2019/0229751 | A1* | 7/2019 | Kim ...................... H03M 13/00 |

OTHER PUBLICATIONS

Huawei et al.,"On Rate Matching for LDPC Codes", 3GPP Draft, R1-1704253, 3rd Generation Partnership Project (3GPP), Mobile Competence Centre, 650, Route Des Lucioles, F-06921 Sophia-Antipolis Cedex, France, vol. RAN WG1, No. Spokane, USA, Apr. 3, 2017-Apr. 7, 2017, Mar. 25, 2017 (Mar. 25, 2017), XP051251062, 4 pages, Retrieved from the Internet: URL: http://www.3gpp.org/ftp/tsg_ran/WG1_RL1/TSGR1_88b/Docs/ [retrieved on Mar. 25, 2017].

International Search Report and Written Opinion—PCT/US2018/046083—ISA/EPO—dated Oct. 30, 2018.

QUALCOMM Incorporated: "LDPC Rate Compatible Design", 3GPP Draft; R1-1700830_LDPC_Rate_Compatible_Design, 3rd Generation Partnership Project (3GPP), Mobile Competence Centre; 650, Route Des Lucioles; F-06921 Sophia-Antipolis Cedex; France, vol. RAN WG1, No. Spokane, USA; Jan. 16, 2017-Jan. 20, 2017, Jan. 16, 2017 (Jan. 16, 2017), 19 Pages, XP051208349, Retrieved from the Internet: URL: http://www.3gpp.org/ftp/Meetings_3GPP_SYNC/RAN1/Docs/ [retrieved on Jan. 16, 2017].

QUALCOMM Incorporated: "LDPC Rate Matching," 3GPP Draft, R1-1711212_LDPC Rate_Matching, 3rd Generation Partnership Project (3GPP), Mobile Competence Centre, 650, Route Des Lucioles, F-06921 Sophia-Antipolis Cedex, France, vol. RAN WG1, No. Qingdao, China, Jun. 27, 2017-Jun. 30, 2017, Jun. 26, 2017 (Jun. 26, 2017), XP051300411, 6 Pages, Retrieved from the Internet: URL: http://www.3gpp.org/ftp/Meetings_3GPP_SYNC/RAN1/Docs/ [retrieved on Jun. 26, 2017].

QUALCOMM Incorporated: "LDPC Rate Matching", 3GPP Draft, R1-1713462_LDPC Rate_Matching, 3rd Generation Partnership Project (3GPP), Mobile Competence Centre, 650, Route Des Lucioles, F-06921 Sophia-Antipolis Cedex, France, vol. RAN WG1, No. Prague, Czech Republic, Aug. 21, 2017-Aug. 25, 2017, Aug. 20, 2017 (Aug. 20, 2017), XP051316263, 7 pages, Retrieved from the Internet :URL: http://www.3gpp.org/ftp/Meetings_3GPP_SYNC/RAN1/Docs/ [retrieved on Aug. 20, 2017].

Mackay D.J.C., "Good Error-Correcting Codes Based on Very Sparse Matrices," IEEE Transactions on Information Theory, Mar. 1999, vol. 45 (2), pp. 399-431.

Roth C., et al., "A 15.8 pJ/bit/iter Quasi-Cyclic LDPC Decoder for IEEE 802.11 n. in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

* cited by examiner

Variable Nodes 210

Check Nodes 220

FIG. 4

SELF-DECODABLE REDUNDANCY VERSIONS FOR LOW-DENSITY PARITY-CHECK CODES

CROSS REFERENCES

The present Application for Patent claims the benefit of U.S. Provisional Patent Application No. 62/544,760 by SORIAGA, et al., entitled "SELF-DECODABLE REDUNDANCY VERSIONS FOR LOW-DENSITY PARITY-CHECK CODES," filed Aug. 11, 2017, which is assigned to the assignee hereof and expressly incorporated herein by reference.

BACKGROUND

The following relates generally to wireless communication and more specifically to self-decodable redundancy versions (RVs) for LDPC codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM).

A wireless multiple-access communications system may include a number of base stations or network access nodes, each simultaneously supporting communication for multiple communication devices, which may be otherwise known as user equipment (UE). Wireless devices in a wireless communications system may transmit data to each other in the form of codewords. These codewords may be encoded by a transmitting device (e.g., a base station or UE) using an encoding algorithm. Error correcting codes may be used to introduce redundancy in a codeword so that transmission errors may be detected and corrected. Some examples of encoding algorithms with error correcting codes include convolutional codes (CCs), LDPC codes, and polar codes.

Wireless devices may also use retransmission techniques to improve the chances that a transmitted codeword is received. For example, wireless devices may support techniques for retransmitting multiple versions of a codeword (e.g., redundancy versions (RVs)) to improve the chances that the codeword is received. The redundancy version may tell a wireless device about the amount of redundancy added into a codeword while encoding. In some cases, some redundancy versions of a codeword may include mainly parity bits that a receiving device may combine with an original transmission of the codeword to decode the codeword. In such cases, however, if a receiving device fails to receive an original transmission of a codeword, the receiving device may not be able to decode some retransmitted versions of the codeword independently to identify any information in the codeword. As a result, a wireless communications system may experience reduced throughput.

SUMMARY

The described techniques relate to improved methods, systems, devices, or apparatuses that support self-decodable redundancy versions for low-density parity-check (LDPC) codes. In some examples, a wireless device (e.g., a user equipment (UE) or a base station) may encode a codeword from a set of information bits using an LDPC code. The wireless device may then transmit multiple versions of the codeword to improve the chances of the codeword being received. In some aspects, the wireless device may use the techniques herein to generate self-decodable redundancy versions of the codeword to be transmitted to the receiving device. Accordingly, a receiving device may be able to identify information bits from one or more redundancy versions of the codeword even if the receiving device failed to receive an original transmission of the codeword.

A method for wireless communication is described. The method may include encoding a set of information bits using a lifted LDPC code for a lifting size value Z from a base graph, the lifted LDPC code having a plurality of variable nodes corresponding to one or more information bits and parity bits and a plurality of check nodes, to generate an encoded bit stream and transmitting a redundancy version corresponding to the set of information bits, the redundancy version either comprising a contiguous set of bits from a circular buffer storing the encoded bit stream or a re-ordered set of bits from the encoded bit stream.

An apparatus for wireless communication is described. The apparatus may include means for encoding a set of information bits using a lifted LDPC code for a lifting size value Z from a base graph, the lifted LDPC code having a plurality of variable nodes corresponding to one or more information bits and parity bits and a plurality of check nodes, to generate an encoded bit stream and means for transmitting a redundancy version corresponding to the set of information bits, the redundancy version either comprising a contiguous set of bits from a circular buffer storing the encoded bit stream or a re-ordered set of bits from the encoded bit stream.

Another apparatus for wireless communication is described. The apparatus may include a processor, memory in electronic communication with the processor, and instructions stored in the memory. The instructions may be operable to cause the processor to encode a set of information bits using a lifted LDPC code for a lifting size value Z from a base graph, the lifted LDPC code having a plurality of variable nodes corresponding to one or more information bits and parity bits and a plurality of check nodes, to generate an encoded bit stream and transmit a redundancy version corresponding to the set of information bits, the redundancy version either comprising a contiguous set of bits from a circular buffer storing the encoded bit stream or a re-ordered set of bits from the encoded bit stream.

A non-transitory computer readable medium for wireless communication is described. The non-transitory computer-readable medium may include instructions operable to cause a processor to encode a set of information bits using a lifted LDPC code for a lifting size value Z from a base graph, the lifted LDPC code having a plurality of variable nodes corresponding to one or more information bits and parity bits and a plurality of check nodes, to generate an encoded bit stream and transmit a redundancy version corresponding to the set of information bits, the redundancy version either comprising a contiguous set of bits from a circular buffer storing the encoded bit stream or a re-ordered set of bits from the encoded bit stream.

Some examples of the method, apparatus, and non-transitory computer-readable medium described above may further include processes, features, means, or instructions for selecting between the contiguous set of bits and the re-ordered set of bits, wherein the transmitting is based at least in part on the selection. Some examples of the method, apparatus, and non-transitory computer-readable medium described above may further include processes, features, means, or instructions for re-ordering bits in the encoded bit stream to create the re-ordered set of bits and writing the re-ordered set of bits to a second circular buffer. Some examples of the method, apparatus, and non-transitory computer-readable medium described above may further include processes, features, means, or instructions for transmitting a contiguous set of bits from the second circular buffer. Some examples of the method, apparatus, and non-transitory computer-readable medium described above may further include processes, features, means, or instructions for selecting a starting bit for reading the contiguous set of bits from the second circular buffer based at least in part on the redundancy version.

Some examples of the method, apparatus, and non-transitory computer-readable medium described above may further include processes, features, means, or instructions for selecting stored bits from the circular buffer for a retransmission based at least in part on the redundancy version and re-ordering the stored bits upon selection, wherein the re-ordered set of bits comprises the re-ordered stored bits. Some examples of the method, apparatus, and non-transitory computer-readable medium described above may further include processes, features, means, or instructions for selecting bits by reading ordered stored bits non-contiguously from the circular buffer, wherein the re-ordered set of bits comprises the selected bits.

Some examples of the method, apparatus, and non-transitory computer-readable medium described above may further include processes, features, means, or instructions for re-ordering bits in the encoded bit stream for a retransmission based at least in part on a code rate of the encoded bit stream.

In some examples of the method, apparatus, and non-transitory computer-readable medium described above, re-ordering bits in the encoded bit stream for the retransmission based at least in part on a code rate of the encoded bit stream includes generating a matrix of bits by allocating bits of the encoded bit stream to a plurality of rows and columns, where a first equal number of bits may be allocated to each row and a second equal number of bits may be allocated to each column; performing a random circular shift on bits in each row of the plurality of rows; selecting bits to be stored in the second circular buffer in order of increasing row index followed by increasing column index; and storing the selected bits.

In some examples of the method, apparatus, and non-transitory computer-readable medium described above, information bits in the set of information bits in the encoded bit stream may be distributed evenly across the selected bits. In some examples of the method, apparatus, and non-transitory computer-readable medium described above, each row includes Z bits. In some examples of the method, apparatus, and non-transitory computer-readable medium described above, the re-ordering may be a structured re-ordering that ensures that retransmissions may be self-decodable for all redundancy versions. In some examples of the method, apparatus, and non-transitory computer-readable medium described above, the re-ordering of the bits in the encoded bit stream may be a random re-ordering.

In some examples of the method, apparatus, and non-transitory computer-readable medium described above, the lifted LDPC code may be restricted to a lifted LDPC code corresponding to a code rate higher than a lowest code rate associated with the base graph. In some examples of the method, apparatus, and non-transitory computer-readable medium described above, the lowest code rate associated with the base graph comprises a mother code. Some examples of the method, apparatus, and non-transitory computer-readable medium described above may further include processes, features, means, or instructions for restricting a size of the mother code for an original transmission and for retransmissions of the set of information bits.

BRIEF DESCRIPTION OF THE DRAWINGS

FIG. 4 illustrates an example of an integer representation of a parity check matrix (PCM) in accordance with various aspects of the present disclosure;

DETAILED DESCRIPTION

Figure 1:
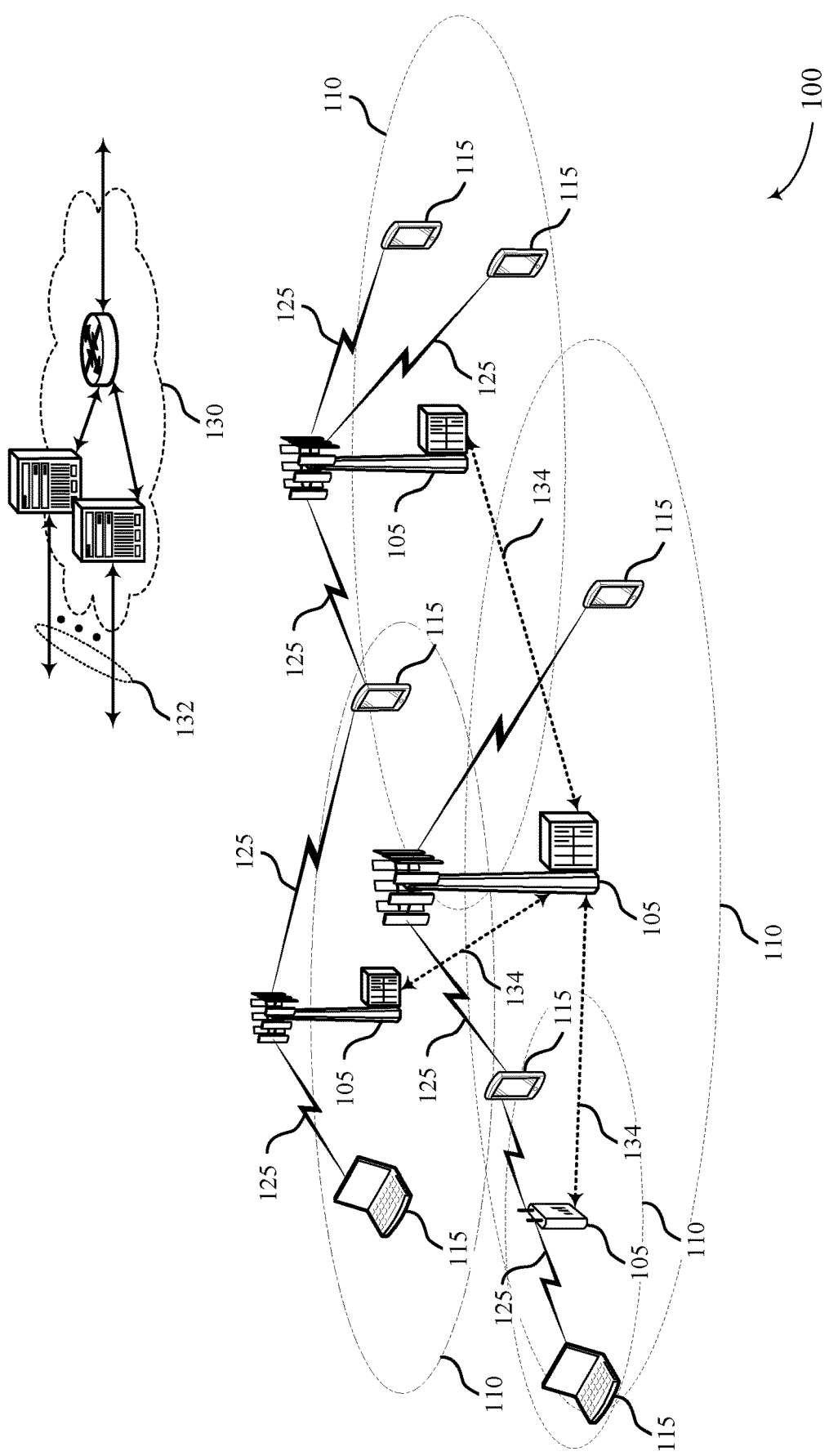
FIG. 1 illustrates an example of a wireless communications system that supports self-decodable redundancy versions for LDPC codes in accordance with various aspects of the present disclosure.

Some wireless communications systems may support the use of error-correcting codes for introducing redundancy in a codeword so that transmission errors may be detected and corrected. These error correcting codes may generally compensate for the intrinsic unreliability of information transfer over the air interface. Low-density parity-check (LDPC) codes are one type of error correcting codes which may be used to increase the robustness of a transmission.

In addition to using error correcting codes, a wireless device may also support retransmissions of a codeword to increase the likelihood that the codeword is received successfully. Each of the multiple transmissions (e.g., and retransmissions) may include some portion of systematic bits (e.g., generated by a kernel of an encoder) and parity bits of the codeword, such that the decoder can use incremental redundancy (IR) to combine the codeword bits received in the multiple transmissions. In some cases, however, when LDPC coding schemes are used, some retransmissions of a codeword may not be self-decodable. That is, the retransmissions of the codeword may not include sufficient information about the encoded data bits to be independently decoded even without any transmission loss. Instead, the retransmissions may provide additional parity bits to allow a receiving device to successfully decode an original transmission of the codeword (e.g., using IR). In such cases, when the receiving device fails to receive the original transmission of the codeword, some retransmissions of the codeword may result in further decoding failures even where the channel would support decoding of the original transmission. These additional decoding failures may result in reduced throughput in a wireless communications system, especially in communications systems where bursty interference is present.

Redundancy versions may find use cases in many aspects of communications, such as grant-free transmissions, ultra-reliable low latency communication (URLLC), system information block (SIB) transmissions, etc. There are four different redundancy versions in NR. Redundancy version 0 (RV0) will normally be the first transmission due to its performance relative to the other RVs. Subsequent transmissions may utilize RV1, RV2, or RV3. RV3 is self-decodable at high coding rates, but its IR combining gain is relatively less than the other RVs. RV1 and RV2 are not self-decodable at high coding rates, but their IR combining gain is better than RV3. In use cases with a tight latency budget (e.g., URLLC), an efficient redundancy version having a good combination of self-decodability at high coding rates and IR combining gain is desirable.

As described herein, a wireless device may support efficient techniques for generating a retransmission for a codeword such that the retransmission may be independently decodable even when an original transmission of the codeword suffered high interference or was not received at all (e.g., when an original transmission grant was missed). Specifically, the wireless device may re-order bits in an encoded bit stream for a retransmission before storing these bits in a circular buffer. Once the bits are re-ordered and stored in the circular buffer, the wireless device may select bits from the buffer and transmit the selected bits to the receiving device. By re-ordering bits in the encoded bit stream, the wireless device may ensure that sets of information bits are distributed evenly across the selected bits. Accordingly, when the wireless device selects bits from the circular buffer for the retransmission, the retransmission may include sufficient systematic bits to enable the retransmission to be decoded by the receiving device with or without being combined with an original transmission.

In one example, the wireless device may re-order the bits in the encoded bit stream by first generating a matrix of bits that includes bits in the encoded bit stream. The matrix may be generated by allocating bits of the encoded bit stream to a number of rows and columns, where an equal number of bits may be allocated to each row and each column. Once the matrix is generated, the wireless device may perform a random circular shift on bits in each of the rows to randomize the bits to be included in the retransmission. The wireless device may then select bits to be stored in a circular buffer in order of increasing row index followed by increasing column index, and the wireless device may store the selected bits in the circular buffer. As such, when the wireless device selects a contiguous set of stored bits from the circular buffer for the retransmission, the selected bits may include sufficient information bits such that the retransmission may be self-decodable.

Aspects of the disclosure introduced above are described below in the context of a wireless communications system. Examples of processes and signaling exchanges that support self-decodable redundancy versions for LDPC codes are then described. Aspects of the disclosure are further illustrated by and described with reference to apparatus diagrams, system diagrams, and flowcharts that relate to self-decodable redundancy versions for LDPC codes.

FIG. 1 illustrates an example of a wireless communications system 100 that supports self-decodable redundancy versions for LDPC codes in accordance with various aspects of the present disclosure. The wireless communications system 100 includes base stations 105, UEs 115, and a core network 130. In some examples, the wireless communications system 100 may be a Long Term Evolution (LTE) network, LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network 130 may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide internet protocol (IP) address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

In some cases, UEs 115 and base stations 105 may support retransmissions of data to increase the likelihood that data is received successfully. Hybrid automatic repeat request (HARQ) feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Wireless communications system 100 may support the use of error-correcting codes for introducing redundancy in a codeword so that transmission errors may be detected and corrected. As discussed above, these error correcting codes may generally compensate for the intrinsic unreliability of information transfer over the air interface. LDPC codes are one type of error correcting codes which use an iterative coding system. Gallager codes are an example of "regular" LDPC codes. Regular LDPC codes are linear block codes in which most of the elements of its parity check matrix H are '0'. LDPC codes can be represented by bipartite graphs (often referred to as "Tanner graphs"). In a bipartite graph, a set of variable nodes corresponds to bits of a codeword (e.g., information bits or systematic bits), and a set of check nodes correspond to a set of parity-check constraints that define the code. Edges in the graph connect variable nodes to check nodes. Thus, the nodes of the graph are separated into two distinctive sets with edges connecting nodes of two different types—variable and check.

Graphs as used in LDPC coding may be characterized in a variety of manners. A lifted code is created by copying a bipartite base graph (G) (or a protograph), a number of times, Z. The number of times is referred to herein as the lifting, lifting size, or lifting size value. A variable node and a check node are considered "neighbors" if they are connected by an "edge" (i.e., the line connecting the variable node and the check node) in the graph. In addition, for each edge (e) of the bipartite base graph (G), a permutation (generally an integer value associated with the edge permutation that is represented by k and referred to as the lifting value) is applied to the Z copies of edge (e) to interconnect the Z copies of G. A bit sequence having a one-to-one association with the variable node sequence is a valid codeword if and only if, for each check node, the bits associated with all neighboring variable nodes sum to 0 modulo 2 (i.e., they include an even number of 1's). The resulting LDPC code may be quasi-cyclic (QC) if the permutations (liftings values) used are cyclic.

Figures 2A, 2B:
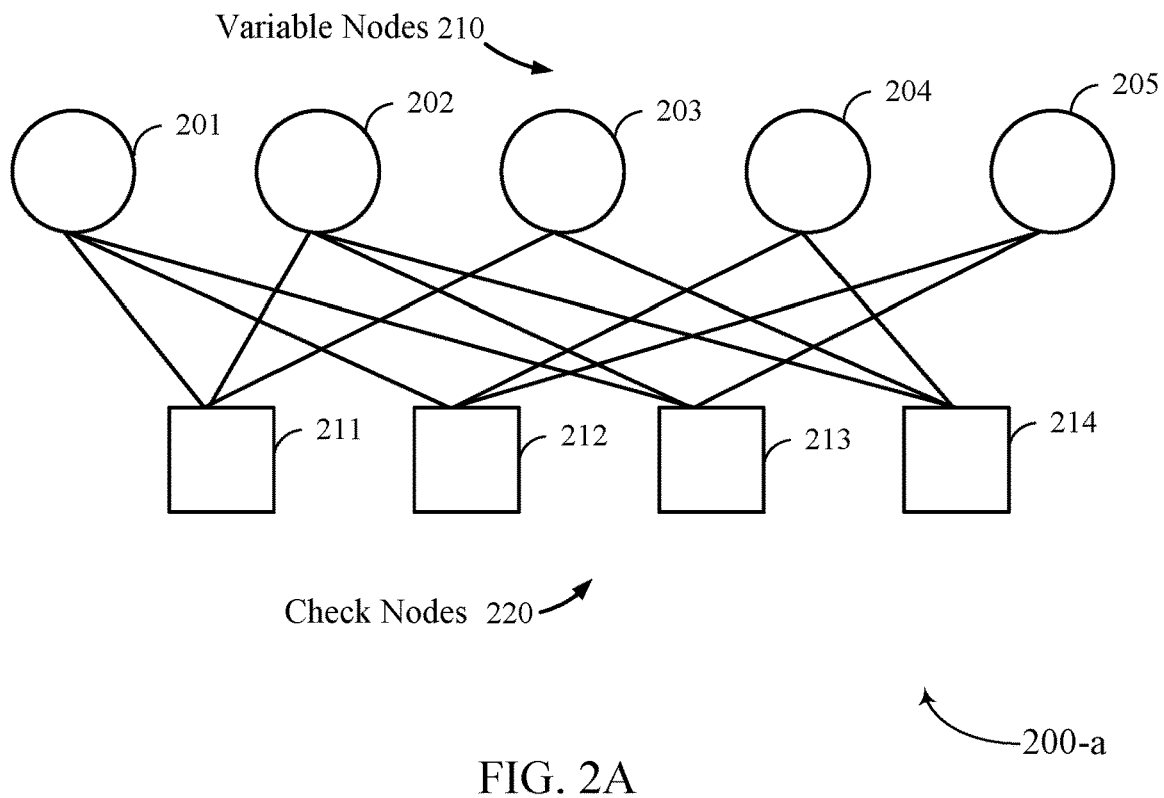
FIGS. 2A and 2B illustrate graphical and matrix representations, respectively, of an example LDPC code in accordance with various aspects of the present disclosure.

FIGS. 2A and 2B illustrate graphical 200-a and matrix representations 200-b, respectively, of an example LDPC code in accordance with various aspects of the present disclosure. For example, FIG. 2 shows a bipartite graph 200-a representing an example LDPC code. Bipartite graph 200-a includes a set of five variable nodes 210 (represented by circles) connected to four check nodes 220 (represented by squares). Edges in bipartite graph 200-a connect variable nodes 210 to check nodes 220 (the edges are represented by the lines connecting variable nodes 210 to check nodes 220). Bipartite graph 200-a consists of $|V|=5$ variable nodes and $|C|=4$ check nodes, connected by $|E|=12$ edges.

Bipartite graph 200-a may be represented by a simplified adjacency matrix, which may also be known as a parity check matrix (PCM). FIG. 2B shows a matrix representation 200-b of bipartite graph 200-a. Matrix representation 200-b includes a PCM H and a codeword vector x, where $x_1$-$x_5$ represent bits of the codeword x. H is used for determining whether a received signal was normally decoded. H has C rows corresponding to j check nodes and V columns corresponding to i variable nodes (i.e., a demodulated symbol), where the rows represent the equations and the columns represent the bits of the codeword. In FIG. 2B, matrix H has four rows and five columns corresponding to four check nodes and five variable nodes, respectively. If a j-th check node is connected to an i-th variable node by an edge (i.e., the two nodes are neighbors), then there is a 1 in the i-th column and in the j-th row of the parity check matrix H. That is, the intersection of an i-th row and a j-th column contains a "1" where an edge joins the corresponding vertices and a "0" where there is no edge. The codeword vector x represents a valid codeword if and only if $H_x=0$, for example, if for each constraint node, the bits neighboring the constraint, via their association with variable nodes, sum to 0 modulo 2 (i.e., they comprise an even number of 1's). Thus, if the codeword is received correctly, then $H_x=0$ (mod 2). When the product of a coded received signal and the PCM H becomes '0', this signifies that no error has occurred.

The number of demodulated symbols or variable nodes is the LDPC code length. The number of non-zero elements in a row (column) is defined as the row (column) weight d(c)d(v). The degree of a node refers to the number of edges connected to that node. For example, as shown in FIG. 2A, the variable node 201 has three degrees of connectivity, with edges connected to check nodes 211, 212, and 213. Variable node 202 has three degrees of connectivity, with edges connected to check nodes 211, 213, and 214. Variable node 203 has two degrees of connectivity, with edges connected to check nodes 211 and 214. Variable node 204 has two degrees of connectivity, with edges connected to check nodes 212 and 214. And variable node 205 has two degrees of connectivity, with edges connected to check nodes 212 and 213. This feature is illustrated in the matrix H shown in FIG. 2B where the number of edges incident to a variable node 210 is equal to the number of 1's in the corresponding column and is called the variable node degree d(v). Similarly, the number of edges connected with a check node 220 is equal to the number of 1's in a corresponding row and is called the check node degree d(c). For example, as shown in FIG. 2B, the first column in the matrix H corresponds to the variable node 201 and the corresponding entries in the column (1, 1, 1, 0) indicates the edge connections to the check nodes 211, 212, and 213, while the 0 indicates that there is not an edge to check node 214. The entries in the second, third, fourth, and fifth columns of H represent the edge connections of the variable nodes 202, 203, 204, and 205, respectively, to the check nodes.

A regular graph or a regular code is one for which all variable nodes have the same degree and all constraint nodes have the same degree. On the other hand, an irregular code has constraint nodes and/or variable nodes of differing degrees. For example, some variable nodes may be of degree 4, others of degree 3, and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. In some cases, LDPC codes can be lifted by taking Z (size of the lift) copies of the base PCM and assigning random permutations (according to integer lifting values k) to each edge bundle to interconnect the Z copies and obtain the final PCM. The final PCM has a blocklength Z times the size of the base PCM. Typically, the permutation used is a cyclic permutation (e.g., using circulant matrices to obtain the final PCM). The final PCM can be represented by replacing the non-zero entries in the base PCM by integers up to the size Z−1. The integer represents the cyclic shift (by that integer value) associated to the lifted bundle of edges in the lifted code structure. These may be referred to as quasi-cyclic LDPC codes.

A cyclically lifted LDPC code can also be interpreted as a code over the ring of binary polynomials modulo $x^z+1$. In this interpretation, a binary polynomial, $(x)=b_0+b_1x+b_2x^2+\ldots+b_{z-1}x^{z-1}$ may be associated to each variable node in the base graph. The binary vector $(b_0, b_1, b_2, \ldots, b_{z-1})$ corresponds to the bits associated to Z corresponding variable nodes in the lifted graph, that is, Z copies of a single base variable node. A cyclic permutation by k (referred to as a lifting value associated to the edges in the graph) of the binary vector is achieved by multiplying the corresponding binary polynomial by $x^k$ where multiplication is taken modulo $x^z+1$. A degree d parity check in the base graph can be interpreted as a linear constraint on the neighboring binary polynomials $B_1(x), \ldots, B_d(x)$, written as $x^{k_1}B_1(x)+x^{k_2}B_2(x)+ \ldots +x^{k_d}B_d(x)=0x^{k_1}B_1(x)+x^{k_2}B_2(x)+ \ldots + x^{k_d}B_d(x)=0$, the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the PCM for the lifted graph can be expressed using the matrix for the base graph in which 1 entries are replaced with monomials of the form $x^k$ and 0 entries are lifted as 0, but now the 0 is interpreted as the 0 binary polynomial modulo $x^z+1$. Such a matrix may be written by giving the value k in place of $x^k$. In this case the 0 polynomial is sometimes represented as "−1" and sometimes as another character in order to distinguish it from $x^0$.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving $M_c$=s=Nd where c and d comprise x. In the case of quasi-cyclic codes, or cyclically lifted codes, the above algebra can be interpreted as being over the ring of binary polynomials modulo $x^z+1$.

A received LDPC codeword can be decoded to produce a reconstructed version of the original codeword. In the absence of errors, or in the case of correctable errors, decoding can be used to recover the original data unit that was encoded. Redundant bits may be used by decoders to detect and correct bit errors. LDPC decoders generally operate by iteratively performing local calculations and passing those results by exchanging messages within the bipartite graph along the edges, and updating these messages by performing computations at the nodes based on the incoming messages. These steps may be repeated several times. For example, each variable node 210 in the graph 200-a may initially be provided with a "soft bit" (e.g., representing the received bit of the codeword) that indicates an estimate of the associated bit's value as determined by observations from the communications channel. Using these soft bits the LDPC decoders may update messages by iteratively reading them, or some portion thereof, from memory and writing an updated message, or some portion thereof, back to memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the codeword length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). If the number of base parity checks is smaller than the degree of a variable node (e.g., the number of edges connected to a variable node), then, in the base graph, that variable node is connected to at least one of the base parity checks by two or more edges.

Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. Eliminating double edges in the LDPC code helps to avoid this extra complexity.

Figure 3:
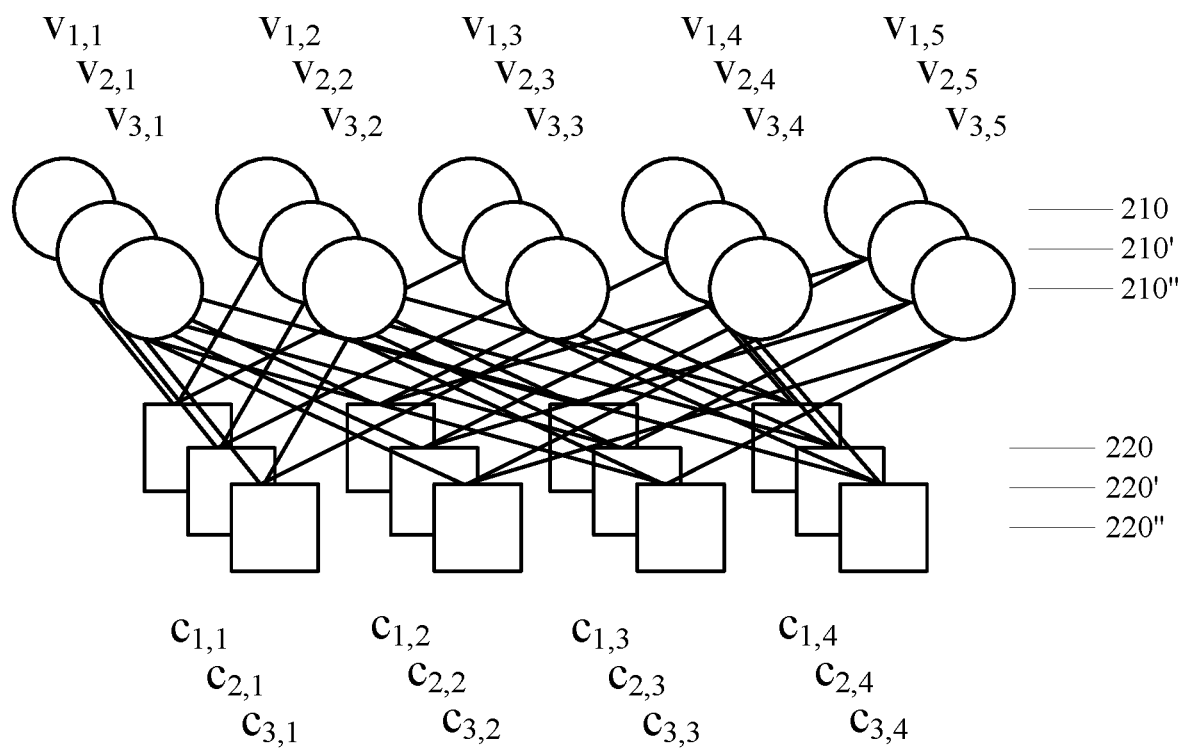
FIG. 3 illustrates an example of a bipartite graph in accordance with various aspects of the present disclosure.
Figure 4:
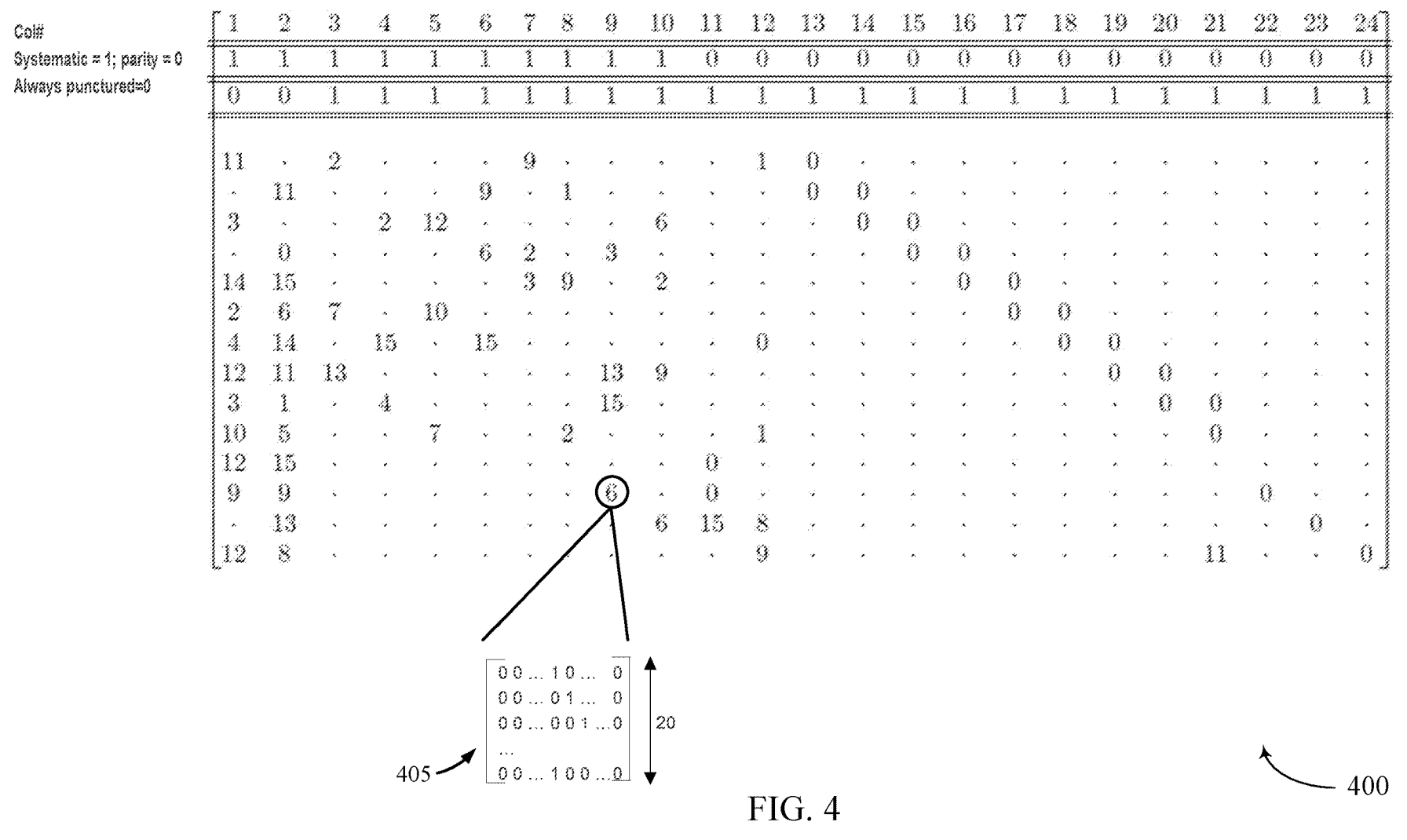

FIG. 3 illustrates an example of a bipartite graph 300 showing liftings of three copies of the bipartite graph 200-a of FIG. 2A in accordance with various aspects of the present disclosure. Three copies (comprising first copy with variable node 210 and check node 220, second copy with variable node 210' and check node 220', and third copy with variable node 210" and check node 220") may be interconnected by permuting like edges among the copies. If the permutations are restricted to cyclic permutations, then the resulting bipartite graph 300 corresponds to a quasi-cyclic LDPC with lifting Z=3. The original graph 200-a from which three copies were made is referred to herein as the base graph. To obtain graphs of different sizes, a "copy and permute" operation can be applied to the base graph. A corresponding PCM of the lifted graph can be constructed from the PCM of the base graph by replacing each entry in the base PCM with a Z×Z matrix. The 0 entries (those having no base edges) are replaced with the 0 matrix and the 1 entries (indicating a base edge) are replaced with a Z×Z permutation matrix. In the case of cyclic liftings, the permutations are cyclic permutations. FIG. 4 illustrates an example of an integer representation of a PCM 400 in accordance with various aspects of the present disclosure. The sub-block 405 shown in FIG. 4 shows a shifted identity matrix for an entry in the base PCM.

Figure 5:
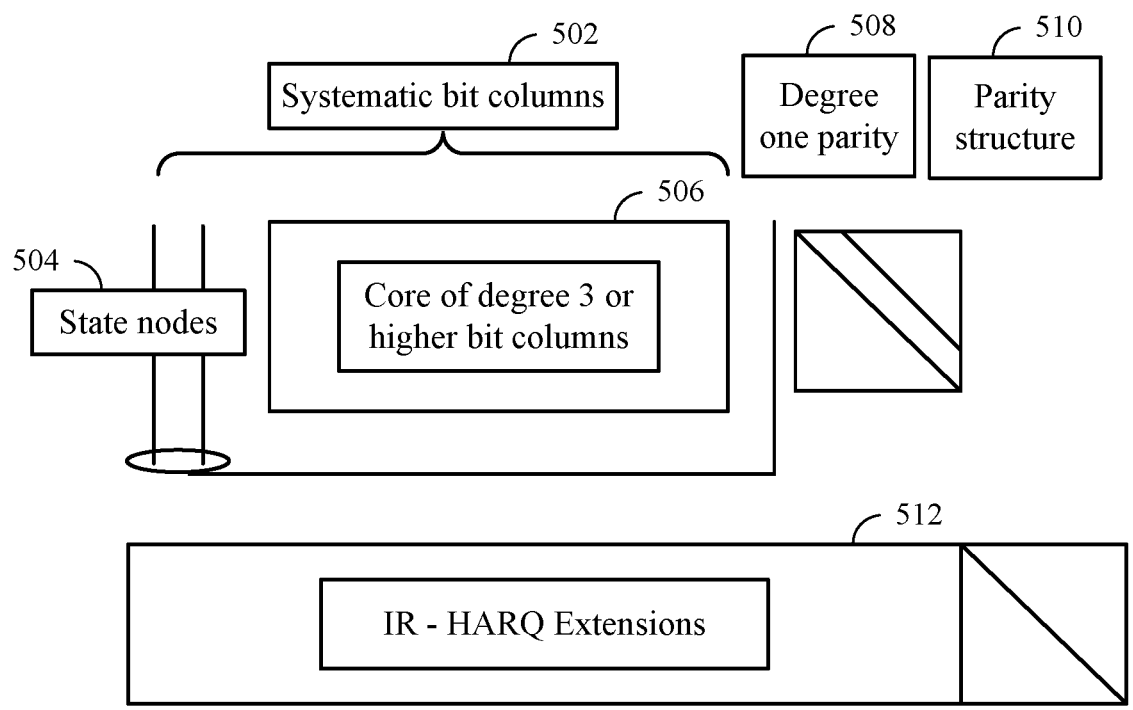
FIG. 5 illustrates a structure of an example base PCM in accordance with various aspects of the present disclosure.

FIG. 5 illustrates an example of a base PCM 500 in accordance with various aspects of the present disclosure. As shown in FIG. 5, the example base PCM 500 has information (systematic) bit columns 502 (i.e., variable nodes) which include a "core" structure 506 of some number of degree 3 or higher variable nodes along with some state (punctured) nodes 504 that are of higher degree, which together form the set of information bit columns 502. For simplicity of description, all of the systematic bit columns other than the high degree punctured state nodes are degree 3, but the disclosed techniques are not so limited.

As shown in FIG. 5, the base PCM 500 structure includes a parity structure 510. The parity structure 510 includes an accumulate chain terminated by a degree 3 node (e.g., similar to the IEEE 802.11n standard LDPC code). Alternate encoding structures may be used, for example to support deeper error floors, and the disclosed techniques may be applied to such variations on the encoding structure. As shown in FIG. 5, the base PCM 500 structure may also include one or more degree one parity bits 508. The degree one parity bits 508 are connected via a check node only to the state nodes.

The bit columns 502 and parity structure 510 may be referred to as the "core graph" or "core PCM". As shown in FIG. 5, the core graph can be extended using additional parity-bits for further incremental redundancy (IR)-HARQ transmissions (IR-HARQ extensions 512) to define codes of a lower code rate than the rate associated to the core graph. The complete graph or some portion beyond the core graph may be referred to as an "extended graph". The core graph has an associated code rate determined by its parameters (i.e., variable nodes, check nodes, edges, puncturing, etc.). Some parity bits in the core graph can be punctured to support code rates above the code rate of the core graph. Lower coding rates may be obtained by extending the core graph with parity bits.

Shortening of the base graph and the lifted graph may be used to achieve the finer granularity in blocklength. The core graph may have a maximum number of information columns, denoted by $k_{b,max}$. When the base code is shortened, one or more information bits are declared known (e.g., by setting the bit to 0} and they are not used in the transmitted code. When a bit in the base graph is known, the entire corresponding column of Z bits in the lifted graph is declared known. The receiver may know a priori the bits that are fixed to 0 and can exploit that knowledge in the decoding process. In parallel decoding architectures an entire known column can be skipped in the decoding process, so the known column incurs no operations at the receiver, hence the coding system can operate as if the base graph were actually smaller. This may not typically apply to shortening that is less than an entire column.

A base graph structure that gives very good performance for shortening over some range is provided. The shortening of the base graph results in a range of supported information columns from a minimum value of $k_{b,min}$ up to a maximum value of $k_{b,max}$. The structure of the shortening guarantees that at most one lifted column of information bits of the lifted graph will be partially shortened. All other information bit columns may be completely used or completely shortened (e.g., shortened at the base graph level). In addition to the information bits in the base graph, the base graph structure can support a number of parity bits in the range from a minimum of $c_{b,min}$ to a maximum of $c_{b,max}$. The minimum may be less than the number of parity bits in the core graph (e.g., some parity bits may be punctured) to support higher transmission rates. The maximum number of parity bits ($c_{b,max}$) corresponds to the maximum number of the parity bits in the extended graph and may be substantially larger than the number of parity bits in the core graph.

Figure 6:
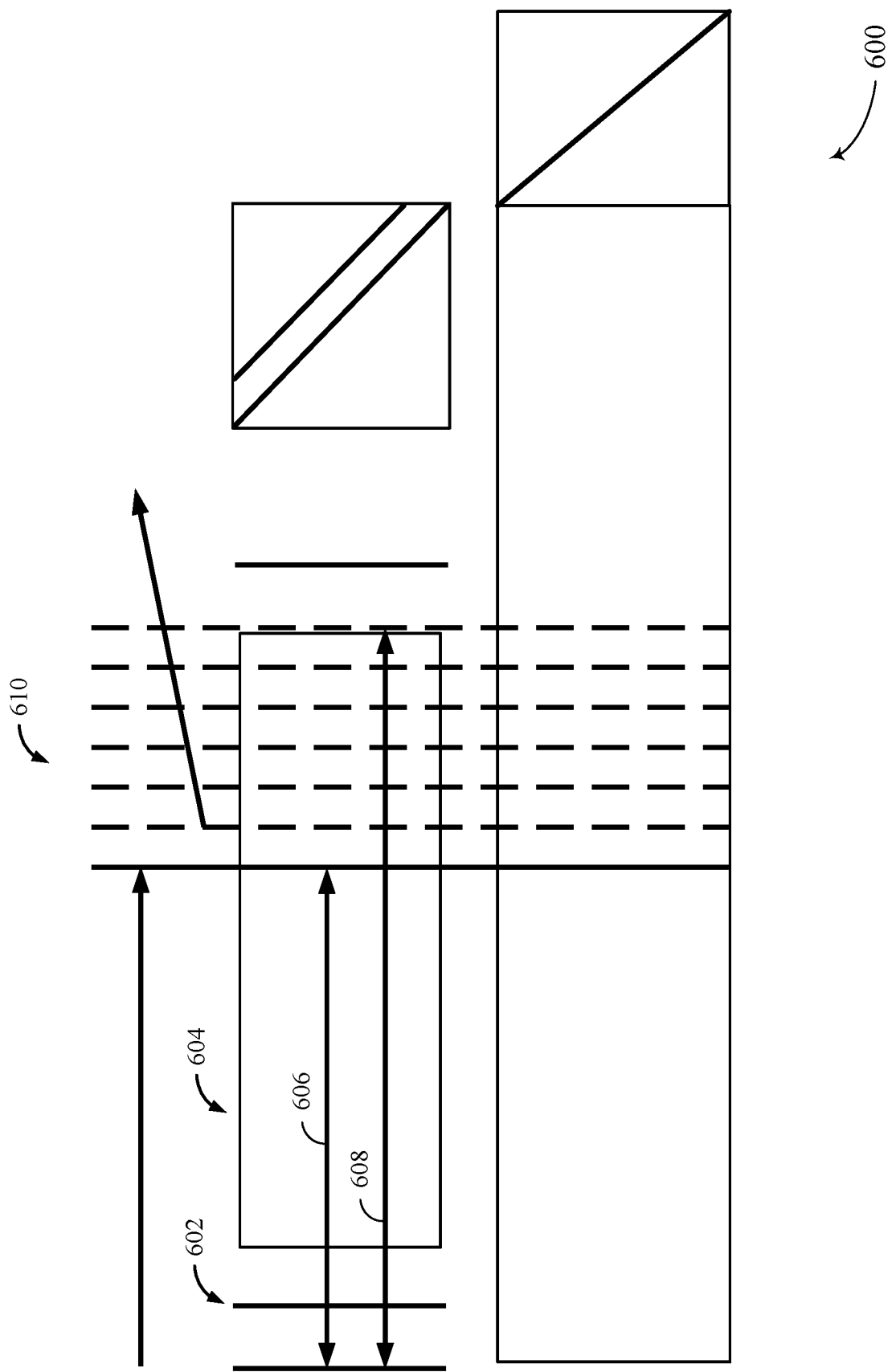
FIG. 6 illustrates an example of an optimized nested base graph in accordance with various aspects of the present disclosure.

The base graph can be designed by a process of successive optimization to ensure that the base graphs for all supported shortenings yield good performance. An example optimized nested base graph 600 is illustrated in FIG. 6. To obtain the optimized base graph 600, a base graph with $k_{b,min}$ information bit columns 606 (for both the core and the extended base graph), including the state nodes 602 and core 604, may be optimized. The total number of parity bits is equal to $c_{b,max}-c_{b,min}$ and may be obtained by puncturing degree two parity bit columns in the core graph so that the base graph yields the desired highest possible coding rate. Once the base graph with $k_{b,min}$ information bit columns is obtained, a column 610 is added to optimize the base graph for performance over $k_{b,min}+1$ information bit columns. Adding of bit columns 610 to the base graph is repeated in an iterative process until an optimized base graph on $k_{b,max}$ information bit columns 608 is obtained.

Figure 7:
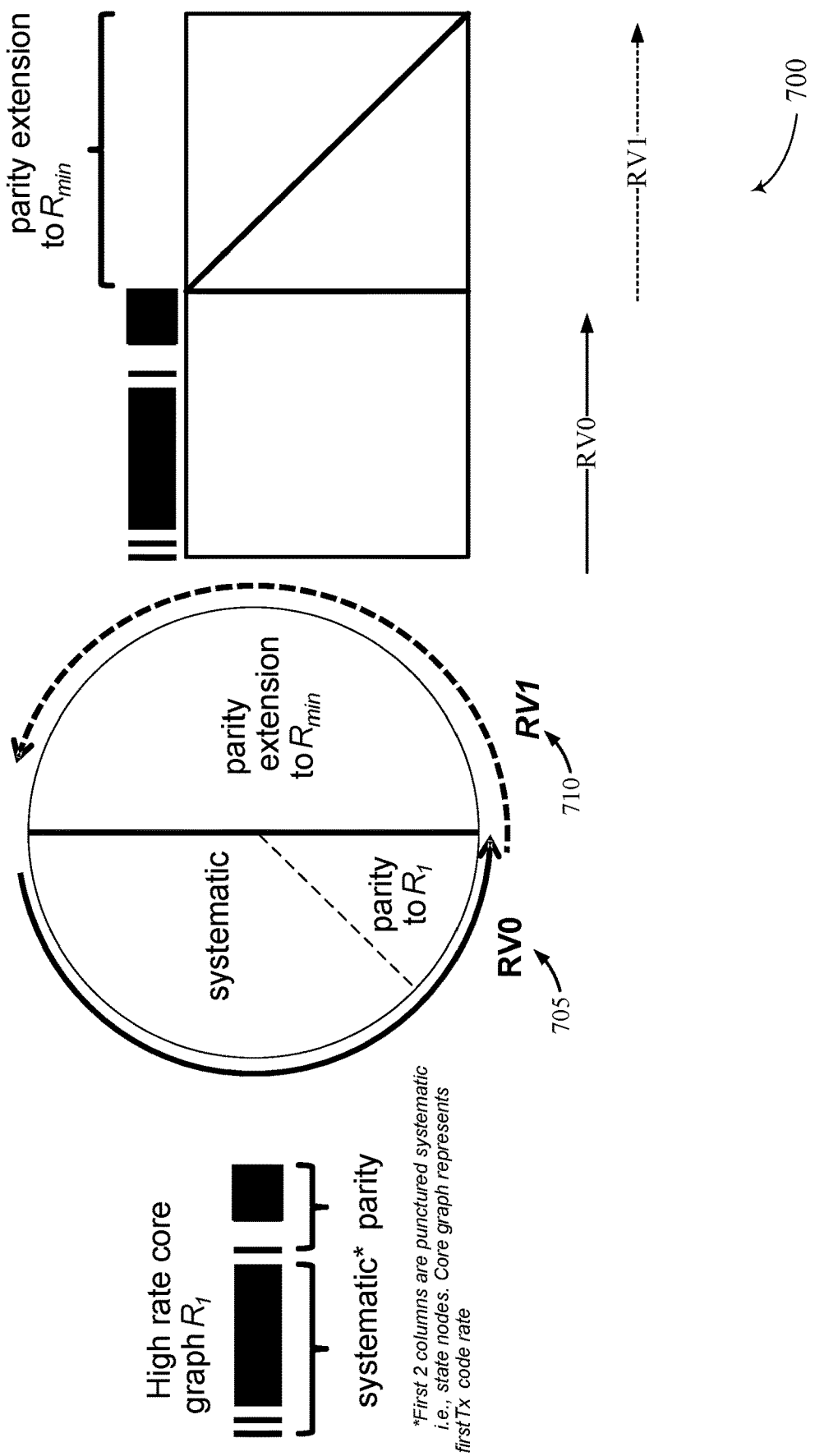
FIG. 7 illustrates an example of an incremental redundancy (IR) hybrid automatic repeat request (HARM) circular buffer in accordance with various aspects of the present disclosure.

FIG. 7 illustrates an example of an IR HARQ circular buffer 700 for the example LDPC code structure of FIG. 6 in accordance with various aspects of the present disclosure. In some cases, a wireless device may encode a set of information bits using a lifted LDPC code to generate an encoded bit stream, and the wireless device may store the encoded bit stream in the IR HARQ circular buffer 700. To determine bits for an original transmission of the encoded bit stream (i.e., RV0 705), the wireless device may select a starting bit (e.g., a first systematic bit), and the wireless device may read a contiguous set of bits from the circular buffer for the original transmission. The wireless device may also read a contiguous set of bits from the circular buffer for a retransmission. In this example, the original transmission or retransmission may include the systematic bits and some portion of the parity bits stored in the circular buffer.

In addition to the original transmission, the wireless device may also be scheduled for one or more retransmissions of the encoded bit stream (e.g., in response to a negative acknowledgement (NACK) received from a receiving device). Accordingly, the wireless device may identify a starting bit (e.g., a first bit subsequent to the last bit transmitted from the circular buffer in the original transmission), and the wireless device may read a contiguous set of bits following the starting bit from the circular buffer for a retransmission (e.g., RV1 710). In the example of FIG. 7, the retransmission may include parity extension bits ($R_{min}$). When a receiving device receives the retransmission, the receiving device may combine the retransmission with the original transmission in the decoding process to identify the information bits in the original transmission. In some cases, the wireless device may gather a contiguous set of encoded bits and re-order the bits. The wireless device may then write the re-ordered set of bits to a second circular buffer. Upon retransmission, the wireless device may transmit the re-ordered set of bits from the second circular buffer. The re-ordered set of bits may be read and transmitted contiguously from the second circular buffer. In some examples, the wireless device may select a starting bit for reading a contiguous set of bits from the second circular buffer. The wireless device may select the starting bit based on a redundancy version of the information bits.

In some examples, the wireless device may read a contiguous set of bits following the starting bit from the circular buffer for a retransmission. The wireless device may re-order the bits upon reading the bits from the circular buffer. Upon retransmission, the wireless device may then transmit the re-ordered bits contiguously. In some examples, the wireless device may re-order the bits upon reading the bits from the circular buffer. The wireless device may thus select bits non-contiguously from the ordered bits stored in the buffer, with the selected non-contiguous bits thus forming a re-ordered set of bits. Upon retransmission, the wireless device may then transmit the selected non-contiguous bits.

In some cases, however, the receiving device may fail to receive the original transmission of the encoded bit stream. As such, if the receiving device receives the retransmission including the parity extension bits, the receiving device may not be able to independently decode these bits. That is, since a retransmission may not include any systematic bits (or only a small number of systematic bits), the retransmission may not be self-decodable, and the retransmission may fail to decode successfully if an original transmission of the encoded bit stream was subject to high interference or was not received at all. As a result, the wireless device may experience reduced throughput and resources used for the retransmission may be wasted.

The techniques described herein allow a wireless device to generate self-decodable retransmissions such that a receiving device may be able to decode the retransmission and identify some information bits even when the receiving device fails to receive an original transmission of the information bits. In some aspects, the wireless device may support techniques for re-ordering bits of an encoded bit stream before storing these bits in a circular buffer for a retransmission such that the retransmission may include at least some information bits and may be self-decodable. The transmitting device may not re-order bits prior to an original transmission because the original transmission may already be associated with a high coding gain and low complexity.

Figure 8:
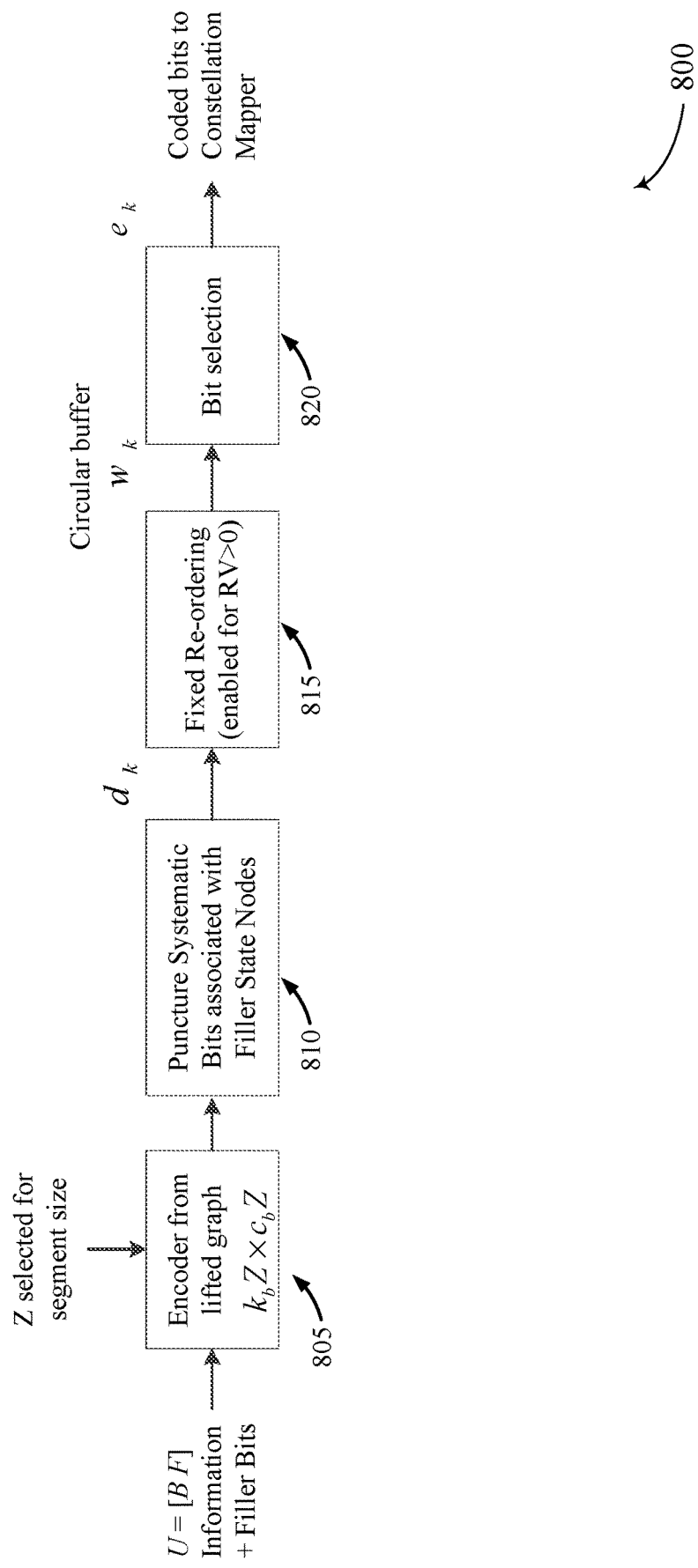
FIG. 8 illustrates a block diagram of an example transmit chain in accordance with various aspects of the present disclosure.

FIG. 8 illustrates an example of a transmit chain 800 in which re-ordering is performed prior to storing bits in a circular buffer for retransmissions in accordance with various aspects of the present disclosure. Although not shown in FIG. 8, prior to encoding, a transmitting device may segment a set of information bits (e.g., corresponding to a transport block) into a number of segments. The transmitting device may then encode each of the segments separately. As shown in FIG. 8, the transmitting device may use the information bits to be transmitted and the selected lifting size value Z to generate a lifted graph (e.g., referred to as the mother code) which may be input to the encoder to encode the information bits at block 805. The encoded bits can be input to the puncturing module which can puncture systematic bits associated with filler state nodes (e.g., according to puncturing pattern) and output a punctured bit stream at block 810.

After performing the operations described above, at block 815 the transmitting device may perform a fixed re-ordering of the punctured bit stream for one or more retransmissions such that the retransmissions may be self-decodable. According to certain aspects, re-ordering can be performed prior to storing the coded bits in a circular buffer to be used to select bits for the retransmission. By re-ordering the bits (e.g., based on a fixed algorithm) before storing the bits in the circular buffer, the transmitting device may evenly distribute information bits across the circular buffer. Accordingly, when the transmitting device selects a contiguous set of bits from the circular buffer for a retransmission, the selected bits may include a number of systematic bits such that the retransmission may be self-decodable. In some cases, the use of these techniques for generating self-decodable retransmissions may result in a minimal loss to the HARQ gain associated with the retransmissions.

Once the bits in the punctured bit stream are re-ordered and stored in the circular buffer, at block 820 the transmitting device may select bits from the circular buffer to be retransmitted. In some cases, the transmitting device may select a starting bit in the circular buffer, and the transmitting device may read a contiguous set of bits from the circular buffer for the retransmission based on a redundancy version associated with the retransmission. Since the re-ordering interleaves systematic bits and parity bits in the circular buffer, when the transmitting device reads sets of contiguous bits from the buffer for a retransmission, the retransmission may each contain both systematic and parity bits and, thus, may be self-decodable.

Figure 9:
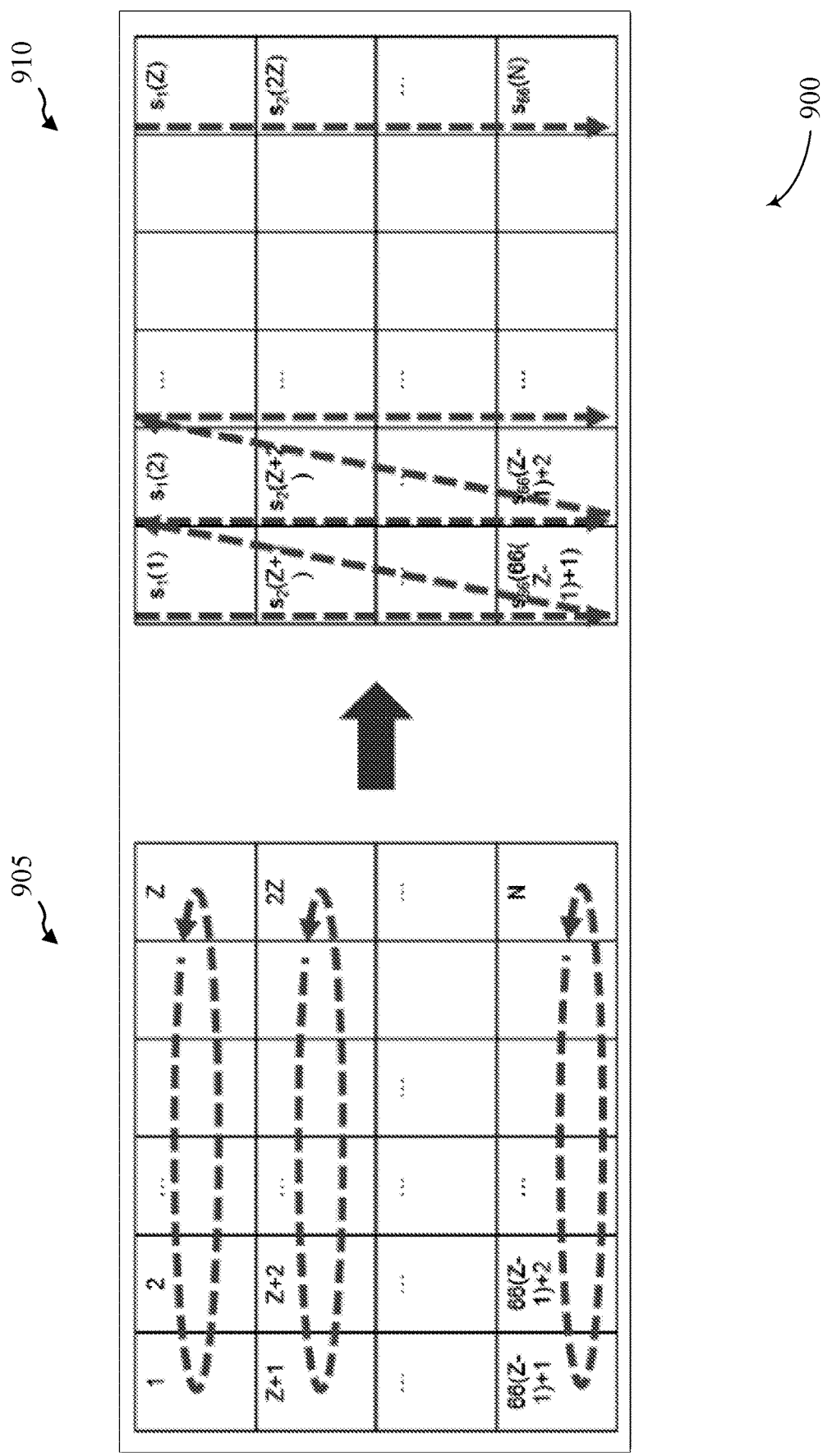
FIG. 9 illustrates an example of re-ordering techniques in accordance with various aspects of the present disclosure.

FIG. 9 illustrates an example of re-ordering techniques 900 that support self-decodable redundancy versions for LDPC codes in accordance with various aspects of the present disclosure. In this example, a transmitting device may generate a matrix of bits that includes bits in the encoded bit stream by allocating bits of the encoded bit stream to a number of rows and columns, where an equal number of bits may be allocated to each row and each column and the bits may be inserted by order of increasing column and then increasing row. In the example of FIG. 9, each of the rows of the matrix may include Z bits. In other examples, however, each of the rows of the matrix may include any number of bits (e.g., greater than one) such that each row includes the same number of bits. That is, the number of bits in each row may be determined based on a factor of the number of bits in the encoded bit stream (N).

Once the matrix is generated, the transmitting device may perform a random circular shift on bits in each of the rows to randomize the bits to be included in the retransmission (as shown in 905). In the case that a number of filler bits are punctured (e.g., from a shortening procedure), the transmitting device may account for the punctured bits. Alternatively, this step may be part of the encoder graph stage in transmit chain 800.

The transmitting device may then select bits 910 to be stored in a circular buffer in order of increasing row index followed by increasing column index. Because the systematic bits are generally found in a first subset of rows of the matrix, the bits stored in the circular buffer may include interleaved systematic and parity bits when selected first by increasing row index. As such, when the transmitting device selects a contiguous set of stored bits from the circular buffer for the retransmission, the selected bits may include sufficient systematic bits such that the retransmission is self-decodable.

Although this example is described as inserting bits into the matrix first by column and then by row and performing a random circular shift on bits in each of the rows, it should be understood that the transmitting device may insert bits into the matrix first by row and then by column and perform this random circular shift on bits in each of the columns (or any other dimension). In this case, the transmitting device may select bits to be stored in the circular buffer in order of increasing column index followed by increasing row index. In other words, the transmitting device may interleave sets of systematic bits and sets of parity bits for retransmissions, and the transmitting device may store the interleaved bits in the circular buffer. Further, although the above examples describe two different buffers for storing the encoded bit stream for an original transmission and storing the re-ordered encoded bit stream for retransmissions, it should be understood that the transmitting device may perform the operations using a single circular buffer. For example, the transmitting device may first store the encoded bit stream in a circular buffer for an original transmission, and then re-order the bits in the circular buffer for retransmissions (e.g., overwriting the original bit order). Although described as a random circular shift, it should be understood that the circular shift may be given by a pseudo-random function such that both the encoder and decoder can determine the circular shift pattern based on known information.

In some examples, alternative interleaving techniques may be used for the re-ordering of the circular buffer for retransmissions. For example, a structured interleaving may be used that maintains a proportion of systematic bits to parity bits within a given window size over the circular buffer size, where the window size may be less than a bit length for transmissions or retransmissions. The structured interleaving thus ensures that retransmissions for each redundancy version are self-decodable. In other examples, a random (e.g., pseudo-random) bit-level interleaving may be used. Random interleaving, especially at lower code rates, may generally approach the results of structured interleaving. However, random interleaving is typically more computationally complex than structured interleaving.

Additionally or alternatively, a transmitting device may be configured to restrict a mother code rate to improve the self-decodability of retransmissions. As discussed above, the mother code may correspond to the lifting graph which may be input to an encoder to encode information bits. The mother code rate may correspond to the code rate of an encoded bit stream generated by the transmitting device. In some aspects, the transmitting device may restrict the mother code rate to code rates higher than the lowest code rate allowable (e.g., the lowest code rate that can be achieved from the base graph (e.g., $\frac{1}{5}$)). As such, the number of systematic bits may be higher in an encoded bit stream which may be stored in a circular buffer.

In such aspects, when the transmitting device selects a contiguous set of bits from the circular buffer to be retransmitted, the retransmission may include more systematic bits than would be included if a lower code rate was used to generate the encoded bit stream. Since the retransmission may include more systematic bits, the self-decodability of the retransmission may be improved. In addition, the restriction of the mother code rate to higher code rates may improve computational complexity and buffer management (e.g., since there may be less parity bits). In some cases, in order to limit the complexity of decoding original transmissions and retransmissions, the mother code rate may be restricted for both original transmissions and retransmissions. In some examples, a first mother code rate (e.g., $\frac{1}{3}$) may be used (e.g., assumed), except at higher peak rates where a different mother code rate (e.g., $\frac{2}{3}$) may be used.

Figure 10:
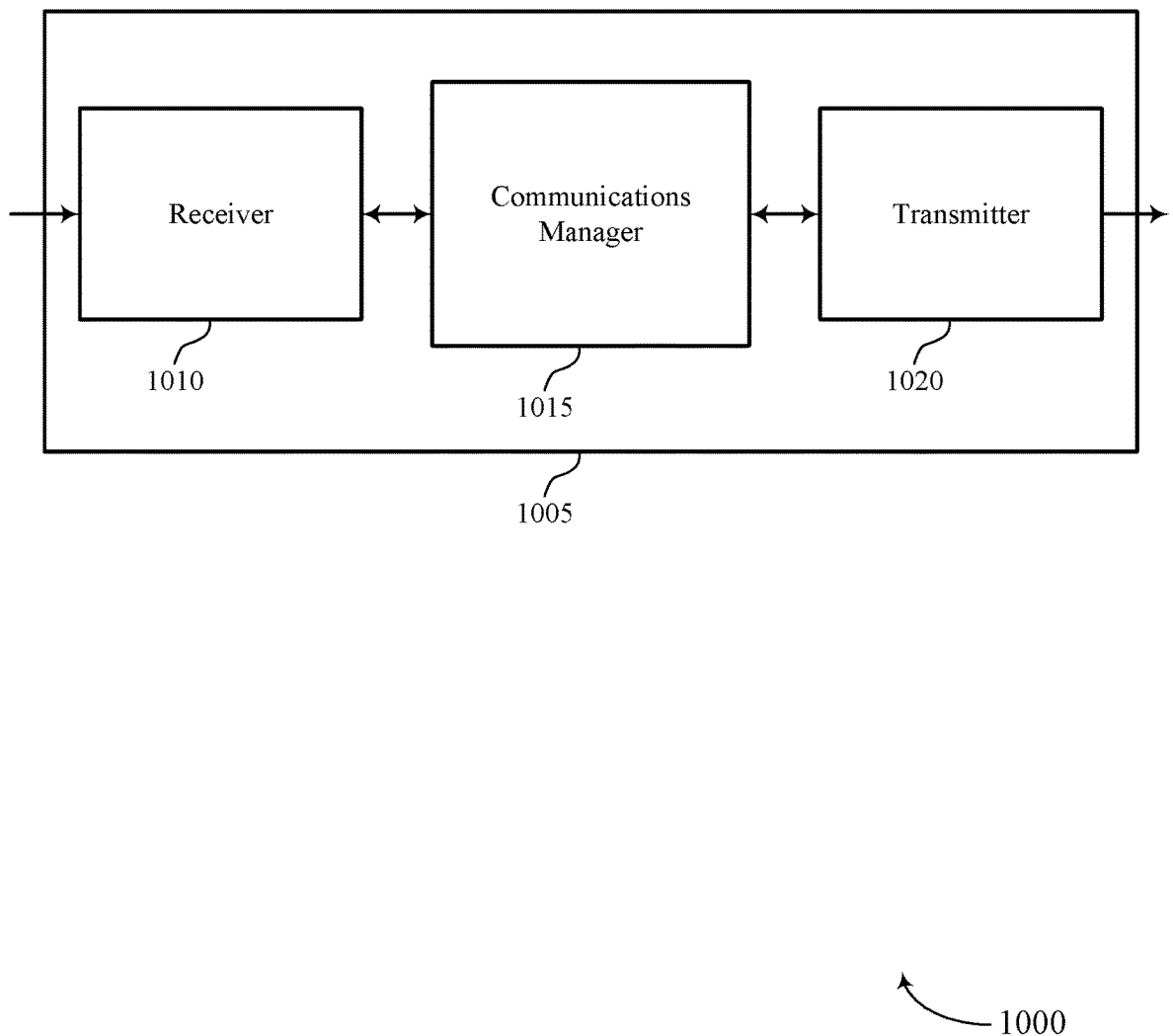
FIGS. 10 and 11 show block diagrams of a device that supports self-decodable redundancy versions for LDPC codes in accordance with various aspects of the present disclosure.

FIG. 10 shows a block diagram 1000 of a wireless device 1005 that supports self-decodable redundancy versions for LDPC codes in accordance with various aspects of the present disclosure. Wireless device 1005 may be an example of aspects of a UE 115 or base station 105 as described herein. Wireless device 1005 may include receiver 1010, communications manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to self-decodable redundancy versions for LDPC codes, etc.). Information may be passed on to other components of the device. The receiver 1010 may be an example of aspects of the transceiver 1235 described with reference to FIG. 12. The receiver 1010 may utilize a single antenna or a set of antennas.

Communications manager 1015 may be an example of aspects of the communications manager 1215 described with reference to FIG. 12. Communications manager 1015 and/or at least some of its various sub-components may be implemented in hardware, software executed by a processor, firmware, or any combination thereof. If implemented in software executed by a processor, the functions of the communications manager 1015 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The communications manager 1015 and/or at least some of its various sub-components may be physically located at various positions, including being distributed such that portions of functions are implemented at different physical locations by one or more physical devices. In some examples, communications manager 1015 and/or at least some of its various sub-components may be a separate and distinct component in accordance with various aspects of the present disclosure. In other examples, communications manager 1015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 1015 may encode a set of information bits using a lifted LDPC code for a lifting size value Z from a base graph, the lifted LDPC code having a set of variable nodes corresponding to one or more information bits and parity bits and a set of check nodes, to generate an encoded bit stream. Communications manager 1015 may then coordinate with transmitter 1020 to transmit a redundancy version corresponding to the set of information bits, the redundancy version either comprising a contiguous set of bits from a circular buffer storing the encoded bit stream or a re-ordered set of bits from the encoded bit stream. In some cases, communications manager 1015 may coordinate with transmitter 1020 to transmit selected bits from the second circular buffer in a retransmission.

Transmitter 1020 may transmit signals generated by other components of the device. In some examples, the transmitter 1020 may be collocated with a receiver 1010 in a transceiver module. Transmitter 1020 may transmit a contiguous set of bits from the second circular buffer. For example, the transmitter 1020 may be an example of aspects of the transceiver 1235 described with reference to FIG. 12. The transmitter 1020 may utilize a single antenna or a set of antennas.

Figure 11:
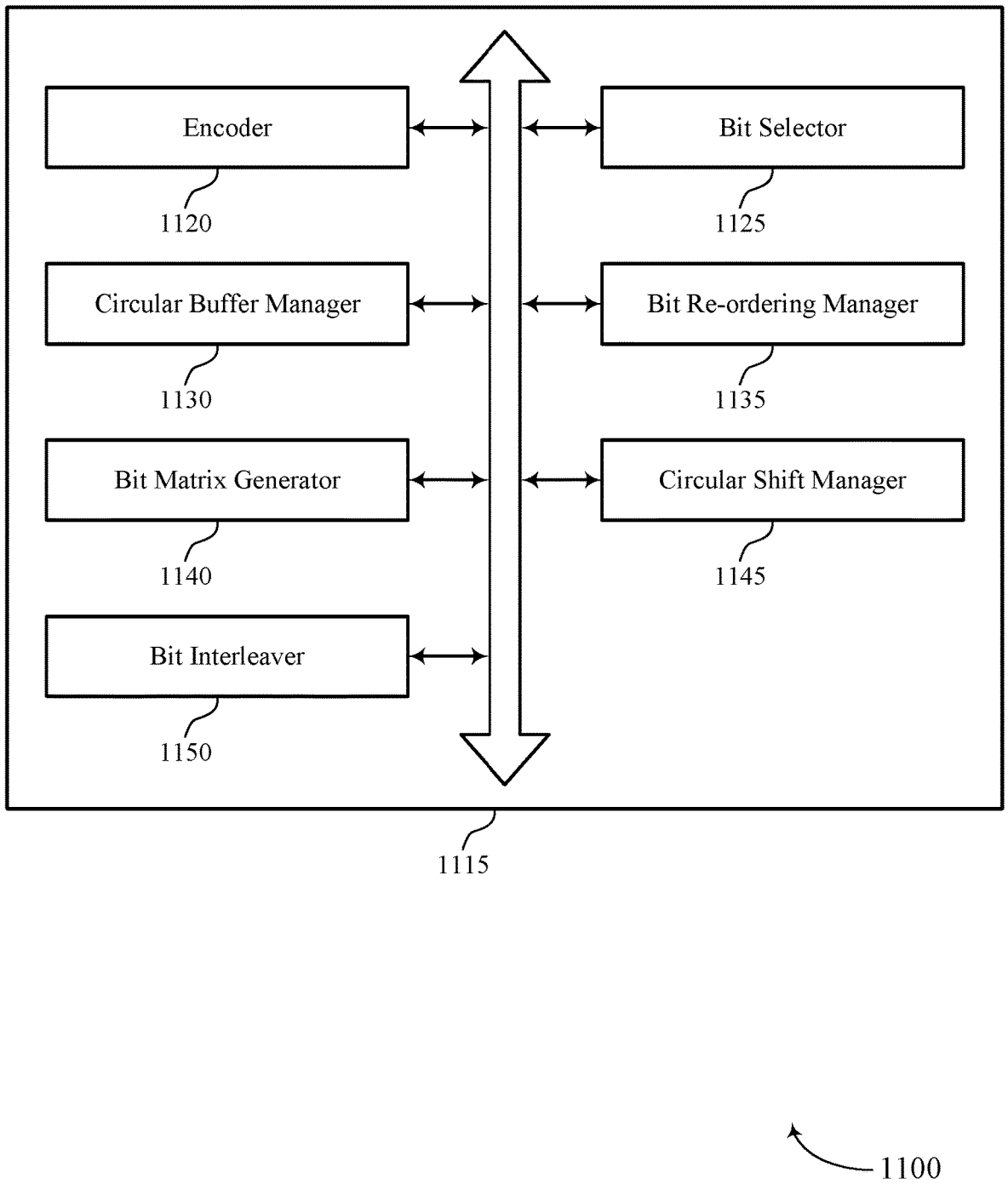

FIG. 11 shows a block diagram 1100 of a communications manager 1115 that supports self-decodable redundancy versions for LDPC codes in accordance with various aspects of the present disclosure. The communications manager 1115 may be an example of aspects of a communications manager 1015, a communications manager 1215, or a communications manager 1315 described with reference to FIGS. 10, 12, and 13. The communications manager 1115 may include encoder 1120, bit selector 1125, circular buffer manager 1130, bit re-ordering manager 1135, bit matrix generator 1140, circular shift manager 1145, and bit interleaver 1150. Each of these modules may communicate, directly or indirectly, with one another (e.g., via one or more buses).

Encoder 1120 may encode a set of information bits using a lifted LDPC code for a lifting size value Z from a base graph, the lifted LDPC code having a set of variable nodes corresponding to one or more information bits and parity bits and a set of check nodes, to generate an encoded bit stream. In some cases, the lifted LDPC code may be restricted to a lifted LDPC code corresponding to a code rate higher than a lowest code rate associated with the base graph. In some cases, the lowest code rate associated with the base graph includes a mother code. In some cases, encoder 1120 may restrict a size of the mother code for an original transmission and for retransmissions of the set of information bits.

Bit re-ordering manager 1135 may re-order bits in the encoded bit stream to create the re-ordered set of bits. In some cases, the re-ordering is a structured re-ordering that ensures that retransmissions are self-decodable for all redundancy versions. In some cases, the re-ordering of the bits in the encoded bit stream is a random re-ordering. Bit re-ordering manager 1135 may re-order the stored bits upon selection. In some cases, the re-ordered set of bits comprises the re-ordered stored bits. Bit re-ordering manager 1135 may re-order stored bits from the circular buffer for a retransmission based at least in part on the redundancy version. Bit re-ordering manager 1135 may also re-order bits in the encoded bit stream for a retransmission based at least in part on a code rate of the encoded bit stream Bit selector 1125 may selecting between the contiguous set of bits and the re-ordered set of bits. In some cases, the transmitting is based at least in part on the selection. Bit selector 1125 may select a starting bit for reading the contiguous set of bits from the second circular buffer based at least in part on the redundancy version. selecting stored bits from the circular buffer for a retransmission based at least in part on the redundancy version. Bit selector 1125 may select bits by reading ordered stored bits non-contiguously from the circular buffer. In some cases, the re-ordered set of bits comprises the selected bits. Bit selector 1125 may select bits in order of increasing row index followed by increasing column index.

Circular buffer manager 1130 may writing the re-ordered set of bits to a second circular buffer. Circular buffer manager 1130 may store the selected bits. Bit matrix generator 1140 may generate a matrix of bits by allocating bits of the encoded bit stream to a set of rows and columns, where a first equal number of bits is allocated to each row and a second equal number of bits is allocated to each column. In some cases, each row includes Z bits. Circular shift manager 1145 may perform a random circular shift on bits in each row of the set of rows. Bit interleaver 1150 may select bits to be stored in the second circular buffer in order of increasing row index followed by increasing column index.

Figure 12:
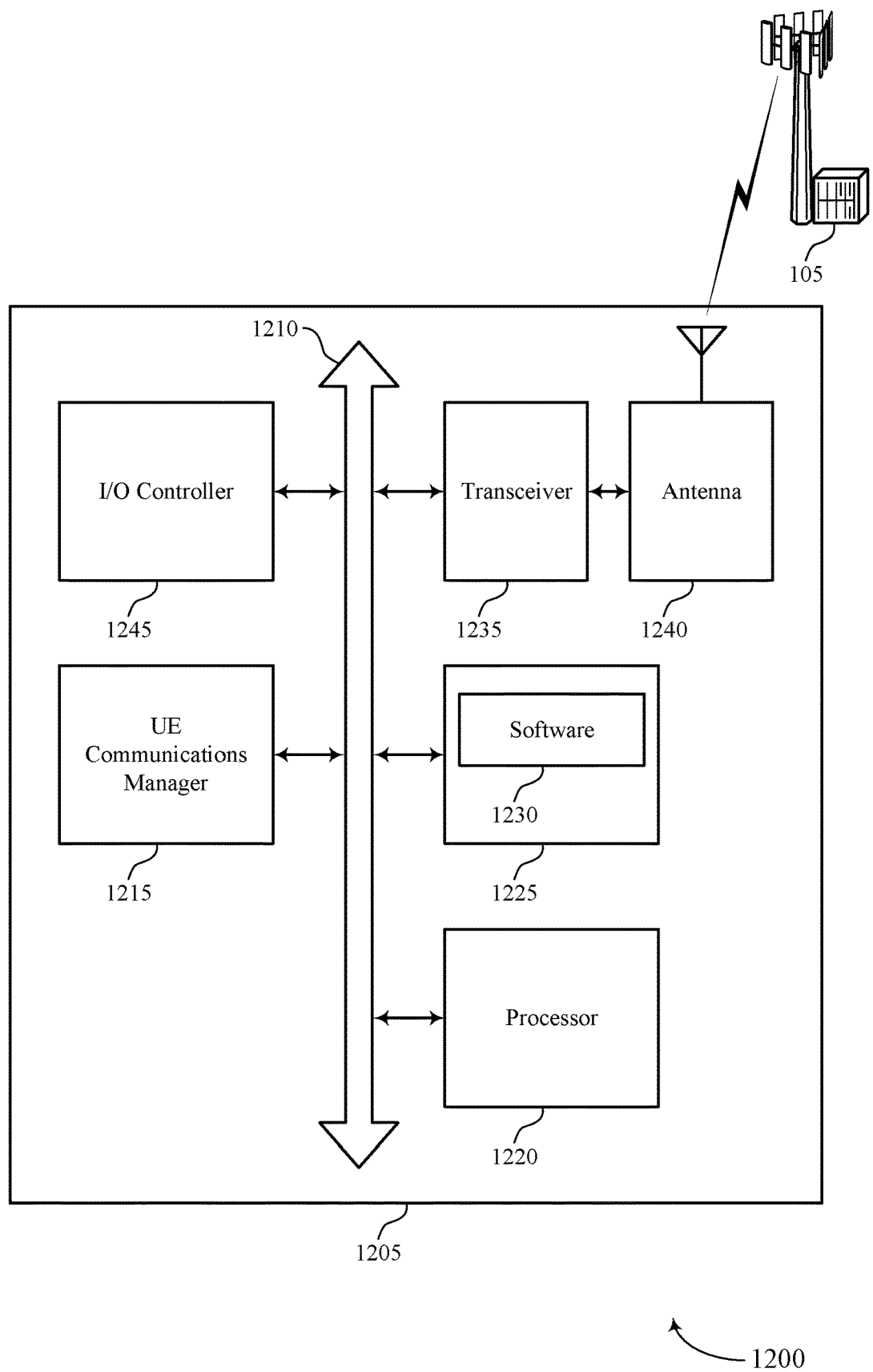
FIG. 12 illustrates a block diagram of a system including a user equipment (UE) that supports self-decodable redundancy versions for LDPC codes in accordance with various aspects of the present disclosure.

FIG. 12 shows a diagram of a system 1200 including a device 1205 that supports self-decodable redundancy versions for LDPC codes in accordance with various aspects of the present disclosure. Device 1205 may be an example of or include the components of wireless device 1005 or a UE 115 as described above, e.g., with reference to FIG. 10. Device 1205 may include components for bi-directional voice and data communications including components for transmitting and receiving communications, including UE communications manager 1215, processor 1220, memory 1225, software 1230, transceiver 1235, antenna 1240, and I/O controller 1245. These components may be in electronic communication via one or more buses (e.g., bus 1210). Device 1205 may communicate wirelessly with one or more base stations 105.

Processor 1220 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting self-decodable redundancy versions for LDPC codes).

Memory 1225 may include random access memory (RAM) and read only memory (ROM). The memory 1225 may store computer-readable, computer-executable software 1230 including instructions that, when executed, cause the processor to perform various functions described herein. In some cases, the memory 1225 may contain, among other things, a basic input/output system (BIOS) which may control basic hardware or software operation such as the interaction with peripheral components or devices. Software 1230 may include code to implement aspects of the present disclosure, including code to support self-decodable redundancy versions for LDPC codes. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas. In some cases, the wireless device may include a single antenna 1240. However, in some cases the device may have more than one antenna 1240, which may be capable of concurrently transmitting or receiving multiple wireless transmissions.

I/O controller 1245 may manage input and output signals for device 1205. I/O controller 1245 may also manage peripherals not integrated into device 1205. In some cases, I/O controller 1245 may represent a physical connection or port to an external peripheral. In some cases, I/O controller 1245 may utilize an operating system such as iOS®, ANDROID®, MS-DOS®, MS-WINDOWS®, OS/2®, UNIX®, LINUX®, or another known operating system. In other cases, I/O controller 1245 may represent or interact with a modem, a keyboard, a mouse, a touchscreen, or a similar device. In some cases, I/O controller 1245 may be implemented as part of a processor. In some cases, a user may interact with device 1205 via I/O controller 1245 or via hardware components controlled by I/O controller 1245.

Figure 13:
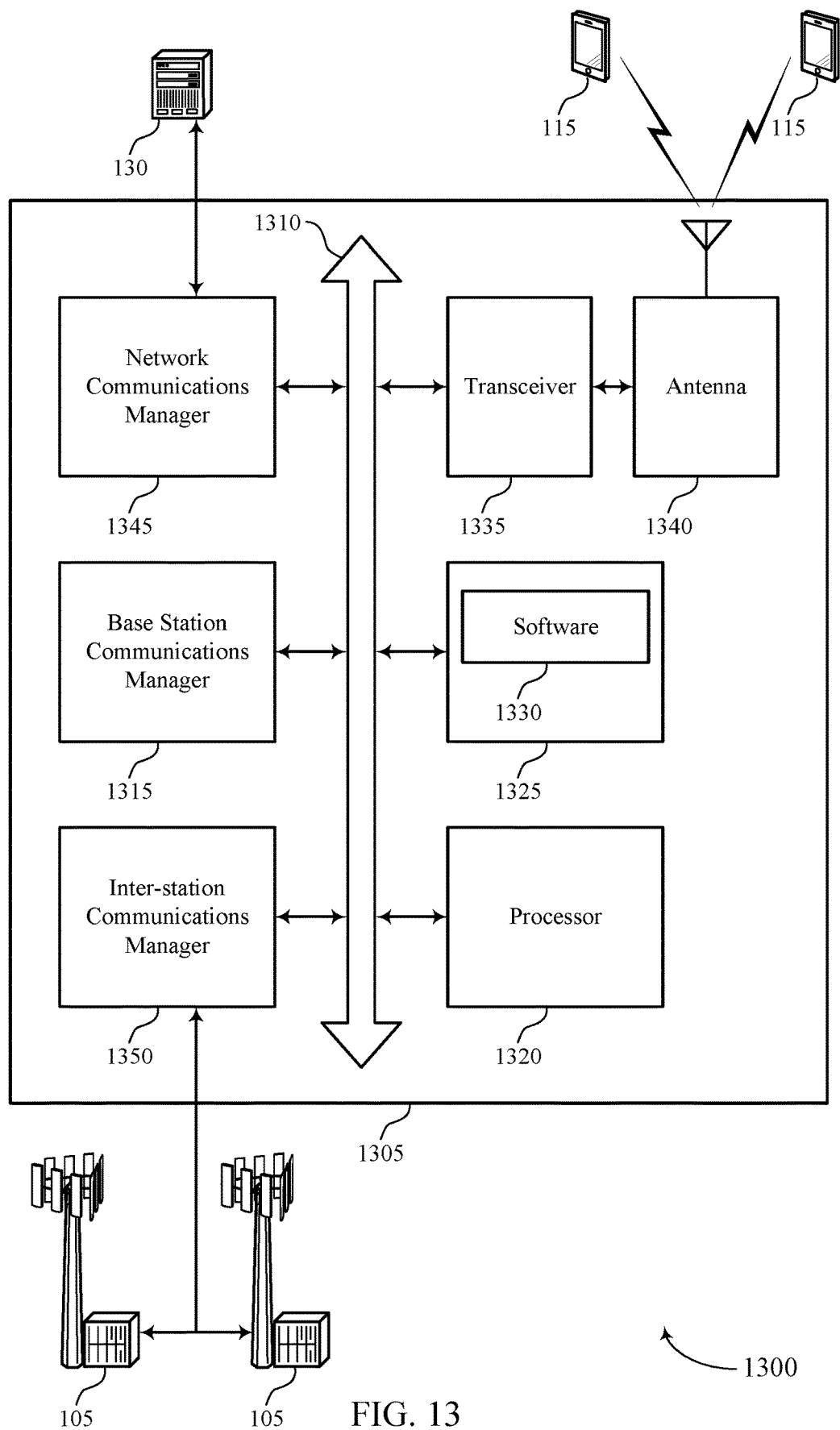
FIG. 13 illustrates a block diagram of a system including a base station that supports self-decodable redundancy versions for LDPC codes in accordance with various aspects of the present disclosure.

FIG. 13 shows a diagram of a system 1300 including a device 1305 that supports self-decodable redundancy versions for LDPC codes in accordance with various aspects of the present disclosure. Device 1305 may be an example of or include the components of wireless device 1005 or a base station 105 as described above, e.g., with reference to FIG. 10. Device 1305 may include components for bi-directional voice and data communications including components for transmitting and receiving communications, including base station communications manager 1315, processor 1320, memory 1325, software 1330, transceiver 1335, antenna 1340, network communications manager 1345, and inter-station communications manager 1350. These components may be in electronic communication via one or more buses (e.g., bus 1310). Device 1305 may communicate wirelessly with one or more UEs 115.

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting self-decodable redundancy versions for LDPC codes).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware or software operation such as the interaction with peripheral components or devices. Software 1330 may include code to implement aspects of the present disclosure, including code to support self-decodable redundancy versions for LDPC codes. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas. In some cases, the wireless device may include a single antenna 1340. However, in some cases the device may have more than one antenna 1340, which may be capable of concurrently transmitting or receiving multiple wireless transmissions.

Network communications manager 1345 may manage communications with the core network (e.g., via one or more wired backhaul links). For example, the network communications manager 1345 may manage the transfer of data communications for client devices, such as one or more UEs 115. Inter-station communications manager 1350 may manage communications with other base station 105, and may include a controller or scheduler for controlling communications with UEs 115 in cooperation with other base stations 105. For example, the inter-station communications manager 1350 may coordinate scheduling for transmissions to UEs 115 for various interference mitigation techniques such as beamforming or joint transmission. In some examples, inter-station communications manager 1350 may provide an X2 interface within an LTE/LTE-A wireless communication network technology to provide communication between base stations 105.

Figure 14:
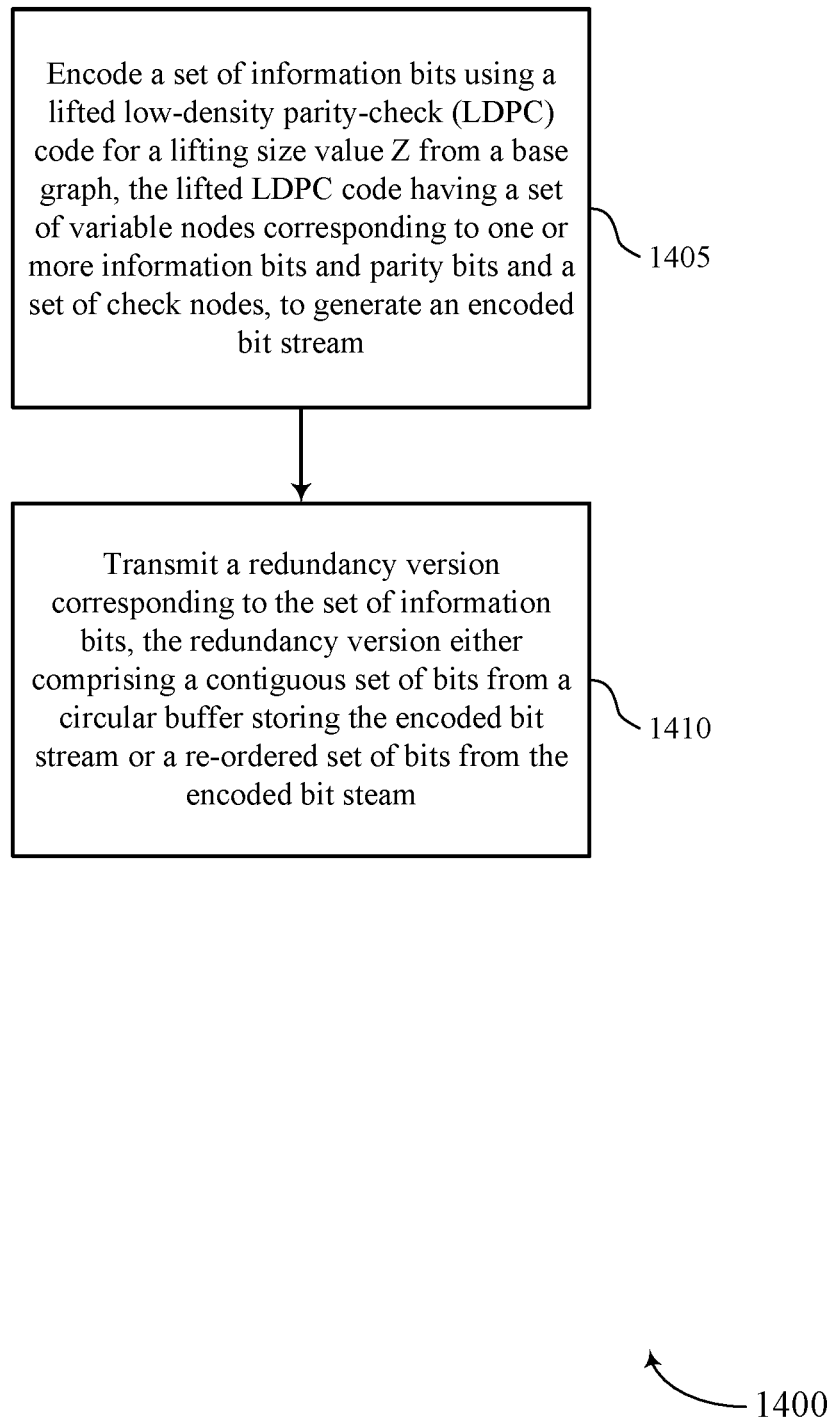
FIGS. 14 and 15 illustrate methods for generating self-decodable redundancy versions for LDPC codes in accordance with various aspects of the present disclosure.

FIG. 14 shows a flowchart illustrating a method 1400 for self-decodable redundancy versions for LDPC codes in accordance with various aspects of the present disclosure. The operations of method 1400 may be implemented by a UE 115 or base station 105 or its components as described herein. For example, the operations of method 1400 may be performed by a communications manager as described with reference to FIGS. 10 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the UE 115 or base station 105 may encode a set of information bits using a lifted LDPC code for a lifting size value Z from a base graph, the lifted LDPC code having a plurality of variable nodes corresponding to one or more information bits and parity bits and a plurality of check nodes, to generate an encoded bit stream. The operations of block 1405 may be performed according to the methods described herein. In certain examples, aspects of the operations of block 1405 may be performed by a encoder as described with reference to FIGS. 10 through 11.

At block 1410 the UE 115 or base station 105 may transmit a redundancy version corresponding to the set of information bits, the redundancy version either comprising a contiguous set of bits from a circular buffer storing the encoded bit stream or a re-ordered set of bits from the encoded bit stream. The operations of block 1410 may be performed according to the methods described herein. In certain examples, aspects of the operations of block 1410 may be performed by a transmitter as described with reference to FIGS. 10 through 11.

Figure 15:
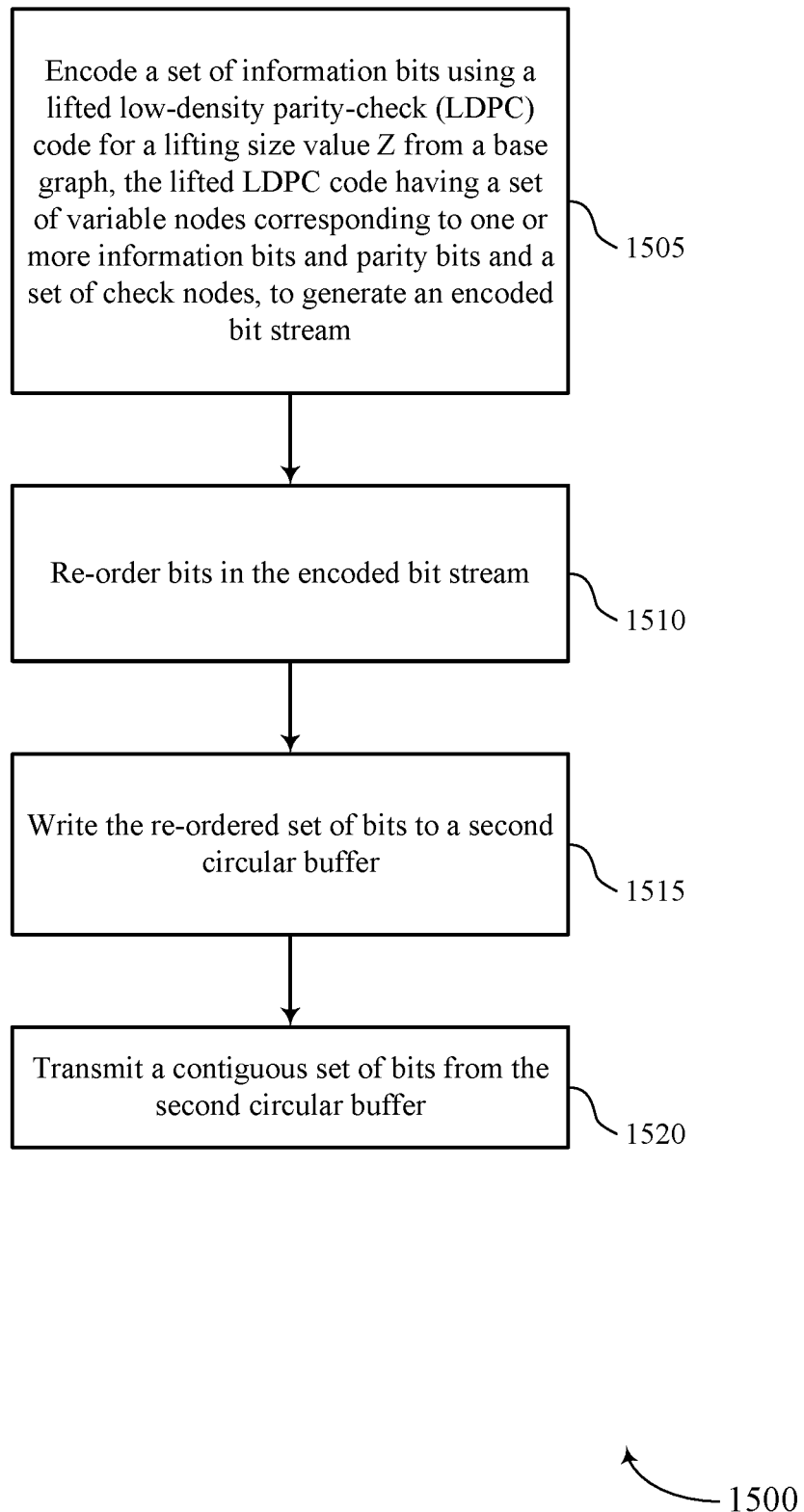

FIG. 15 shows a flowchart illustrating a method 1500 for self-decodable redundancy versions for LDPC codes in accordance with various aspects of the present disclosure. The operations of method 1500 may be implemented by a UE 115 or base station 105 or its components as described herein. For example, the operations of method 1500 may be performed by a communications manager as described with reference to FIGS. 10 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1505 the UE 115 or base station 105 may encode a set of information bits using a lifted LDPC code for a lifting size value Z from a base graph, the lifted LDPC code having a plurality of variable nodes corresponding to one or more information bits and parity bits and a plurality of check nodes, to generate an encoded bit stream. The operations of block 1505 may be performed according to the methods described herein. In certain examples, aspects of the operations of block 1505 may be performed by a encoder as described with reference to FIGS. 10 through 11.

At block 1510 the UE 115 or base station 105 may re-order bits in the encoded bit stream. The operations of block 1510 may be performed according to the methods described herein. In certain examples, aspects of the operations of block 1510 may be performed by a bit re-ordering manager as described with reference to FIGS. 10 through 11.

At block 1515 the UE 115 or base station 105 may write the re-ordered set of bits to a second circular buffer. The operations of block 1515 may be performed according to the methods described herein. In certain examples, aspects of the operations of block 1515 may be performed by a circular buffer manager as described with reference to FIGS. 10 through 11.

At block 1520 the UE 115 or base station 105 may transmit a contiguous set of bits from the second circular buffer. The operations of block 1520 may be performed according to the methods described herein. In certain examples, aspects of the operations of block 1520 may be performed by a transmitter as described with reference to FIGS. 10 through 11.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    encoding a set of information bits using a lifted low-density parity-check (LDPC) code for a lifting size value Z from a base graph, the lifted LDPC code having a plurality of variable nodes corresponding to one or more information bits and parity bits and a plurality of check nodes, to generate an encoded bit stream;
    re-ordering bits in the encoded bit stream to create a re-ordered set of bits;
    writing the re-ordered set of bits to a second circular buffer; and
    transmitting a redundancy version corresponding to the set of information bits, the redundancy version either comprising a contiguous set of bits from a first circular buffer storing the encoded bit stream or the re-ordered set of bits from the second circular buffer.

2. The method of claim 1, further comprising:
    selecting between the contiguous set of bits and the re-ordered set of bits, wherein the transmitting is based at least in part on the selection.

3. The method of claim 1, wherein transmitting the redundancy version comprises:
    transmitting a contiguous set of bits from the second circular buffer.

4. The method of claim 1, further comprising:
    selecting a starting bit for reading the contiguous set of bits from the second circular buffer based at least in part on the redundancy version.

5. The method of claim 1, further comprising:
    selecting stored bits from the first circular buffer for a retransmission based at least in part on the redundancy version; and
    re-ordering the stored bits upon selection, wherein the re-ordered set of bits comprises the re-ordered stored bits.

6. The method of claim 1, further comprising:
    selecting bits by reading stored bits non-contiguously from the first circular buffer, wherein the re-ordered set of bits comprises the selected bits.

7. The method of claim 1, further comprising:
re-ordering bits in the encoded bit stream for a retransmission based at least in part on a code rate of the encoded bit stream.

8. The method of claim 7, wherein re-ordering bits in the encoded bit stream for the retransmission comprises:
generating a matrix of bits by allocating bits of the encoded bit stream to a plurality of rows and columns, wherein a first equal number of bits is allocated to each row and a second equal number of bits is allocated to each column;
the method further comprising:
performing a random circular shift on bits in each row of the plurality of rows;
selecting bits in order of increasing row index followed by increasing column index; and
storing the selected bits.

9. The method of claim 8, wherein information bits in the set of information bits in the encoded bit stream are distributed evenly across the selected bits.

10. The method of claim 8, wherein each row includes Z bits.

11. The method of claim 7, wherein the re-ordering is a structured re-ordering that ensures that retransmissions are self-decodable for all redundancy versions.

12. The method of claim 7, wherein the re-ordering of the bits in the encoded bit stream is a random re-ordering.

13. The method of claim 1, wherein the lifted LDPC code is restricted to a lifted LDPC code corresponding to a code rate higher than a lowest code rate associated with the base graph.

14. The method of claim 13, wherein the lowest code rate associated with the base graph comprises a mother code.

15. The method of claim 14, further comprising:
restricting a size of the mother code for an original transmission and for retransmissions of the set of information bits.

16. An apparatus for wireless communication, comprising:
a processor;
memory in electronic communication with the processor; and
instructions stored in the memory and operable, when executed by the processor, to cause the apparatus to:
encode a set of information bits using a lifted low-density parity-check (LDPC) code for a lifting size value Z from a base graph, the lifted LDPC code having a plurality of variable nodes corresponding to one or more information bits and parity bits and a plurality of check nodes, to generate an encoded bit stream;
re-order bits in the encoded bit stream to create a re-ordered set of bits;
write the re-ordered set of bits to a second circular buffer; and
transmit a redundancy version corresponding to the set of information bits, the redundancy version either comprising a contiguous set of bits from a first circular buffer storing the encoded bit stream or the re-ordered set of bits from the second circular buffer.

17. The apparatus of claim 16, wherein the instructions are further executable by the processor to cause the apparatus to:
select between the contiguous set of bits and the re-ordered set of bits, wherein the transmitting is based at least in part on the selection.

18. The apparatus of claim 16, wherein the instructions to transmit the redundancy version are further executable by the processor to cause the apparatus to:
transmit a contiguous set of bits from the second circular buffer.

19. The apparatus of claim 16, wherein the instructions are further executable by the processor to cause the apparatus to:
select a starting bit for reading the contiguous set of bits from the second circular buffer based at least in part on the redundancy version.

20. The apparatus of claim 16, wherein the instructions are further executable by the processor to cause the apparatus to:
select stored bits from the first circular buffer for a retransmission based at least in part on the redundancy version; and
re-order the stored bits upon selection, wherein the re-ordered set of bits comprises the re-ordered stored bits.

21. The apparatus of claim 16, wherein the instructions are further executable by the processor to cause the apparatus to:
select bits by reading stored bits non-contiguously from the first circular buffer, wherein the re-ordered set of bits comprises the selected bits.

22. The apparatus of claim 16, wherein the instructions are further executable by the processor to cause the apparatus to:
re-order bits in the encoded bit stream for a retransmission based at least in part on a code rate of the encoded bit stream.

23. The apparatus of claim 22, wherein the instructions to re-order bits in the encoded bit stream for the retransmission are further executable by the processor to cause the apparatus to:
generate a matrix of bits by allocating bits of the encoded bit stream to a plurality of rows and columns, wherein a first equal number of bits is allocated to each row and a second equal number of bits is allocated to each column;
the instructions further executable by the processor to cause the apparatus to:
perform a random circular shift on bits in each row of the plurality of rows;
select bits in order of increasing row index followed by increasing column index; and
store the selected bits.

24. The apparatus of claim 23, wherein information bits in the set of information bits in the encoded bit stream are distributed evenly across the selected bits.

25. The apparatus of claim 22, wherein the re-ordering is a structured re-ordering that ensures that retransmissions are self-decodable for all redundancy versions.

26. The apparatus of claim 16, wherein the lifted LDPC code is restricted to a lifted LDPC code corresponding to a code rate higher than a lowest code rate associated with the base graph, and wherein the lowest code rate associated with the base graph comprises a mother code;
the instructions further executable by the processor to cause the apparatus to restrict a size of the mother code for an original transmission and for retransmissions of the set of information bits.

27. An apparatus for wireless communication, comprising:
means for encoding a set of information bits using a lifted low-density parity-check (LDPC) code for a lifting size value Z from a base graph, the lifted LDPC code having a plurality of variable nodes corresponding to one or more information bits and parity bits and a plurality of check nodes, to generate an encoded bit stream;

means for re-ordering bits in the encoded bit stream to create a re-ordered set of bits;

means for writing the re-ordered set of bits to a second circular buffer; and means for transmitting a redundancy version corresponding to the set of information bits, the redundancy version either comprising a contiguous set of bits from a first circular buffer storing the encoded bit stream or the re-ordered set of bits from the second circular buffer.

28. A non-transitory computer readable medium storing code for wireless communication, the code comprising instructions executable by a processor to:

encode a set of information bits using a lifted low-density parity-check (LDPC) code for a lifting size value Z from a base graph, the lifted LDPC code having a plurality of variable nodes corresponding to one or more information bits and parity bits and a plurality of check nodes, to generate an encoded bit stream;

re-order bits in the encoded bit stream to create a re-ordered set of bits;

write the re-ordered set of bits to a second circular buffer; and transmit a redundancy version corresponding to the set of information bits, the redundancy version either comprising a contiguous set of bits from a first circular buffer storing the encoded bit stream or the re-ordered set of bits from the second circular buffer.

* * * * *